US008648470B2

(12) United States Patent
Lin et al.

(10) Patent No.: US 8,648,470 B2
(45) Date of Patent: Feb. 11, 2014

(54) SEMICONDUCTOR DEVICE AND METHOD OF FORMING FO-WLCSP WITH MULTIPLE ENCAPSULANTS

(75) Inventors: Yaojian Lin, Singapore (SG); Jose Alvin Caparas, Singapore (SG); Kang Chen, Singapore (SG); Hin Hwa Goh, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 76 days.

(21) Appl. No.: 13/326,157

(22) Filed: Dec. 14, 2011

(65) Prior Publication Data

US 2012/0187568 A1 Jul. 26, 2012

Related U.S. Application Data

(60) Provisional application No. 61/435,229, filed on Jan. 21, 2011.

(51) Int. Cl.
*H01L 23/538* (2006.01)

(52) U.S. Cl.
USPC .... 257/774; 257/773; 257/787; 257/E21.502; 257/E23.174; 257/E21.504

(58) Field of Classification Search
USPC ................ 257/678–733, 787–796, 257/E23.001–E23.194
See application file for complete search history.

(56) References Cited

U.S. PATENT DOCUMENTS

| 7,741,148 | B1 | 6/2010 | Marimuthu et al. | |
|---|---|---|---|---|
| 7,838,337 | B2 | 11/2010 | Marimuthu et al. | |
| 2008/0144322 | A1* | 6/2008 | Norfidathul et al. | 362/310 |
| 2009/0212420 | A1 | 8/2009 | Hedler et al. | |
| 2011/0101385 | A1* | 5/2011 | Medendorp, Jr. | 257/88 |

* cited by examiner

*Primary Examiner* — Mamadou Diallo
(74) *Attorney, Agent, or Firm* — Robert D. Atkins; Patent Law Group: Atkins & Associates, P.C.

(57) ABSTRACT

A semiconductor device has a first semiconductor die including TSVs mounted to a carrier with a thermally releasable layer. A first encapsulant having a first coefficient of thermal expansion CTE is deposited over the first semiconductor die. The first encapsulant includes an elevated portion in a periphery of the first encapsulant that reduces warpage. A surface of the TSVs is exposed. A second semiconductor die is mounted to the surface of the TSVs and forms a gap between the first and second semiconductor die. A second encapsulant having a second CTE is deposited over the first and second semiconductor die and within the gap. The first CTE is greater than the second CTE. In one embodiment, the first and second encapsulants are formed in a chase mold. An interconnect structure is formed over the first and second semiconductor die.

24 Claims, 22 Drawing Sheets

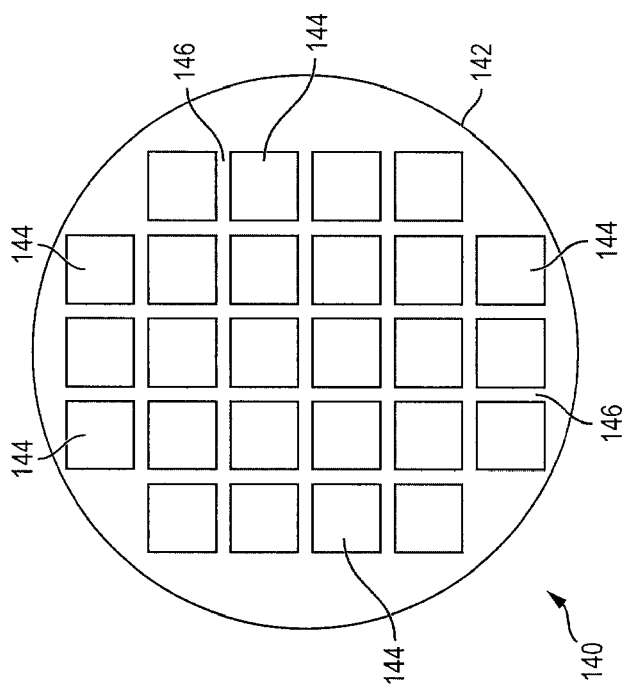
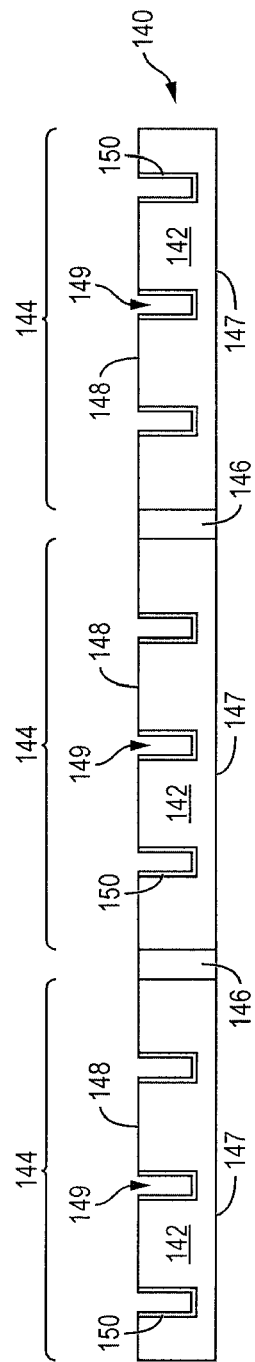
FIG. 4a
FIG. 4b

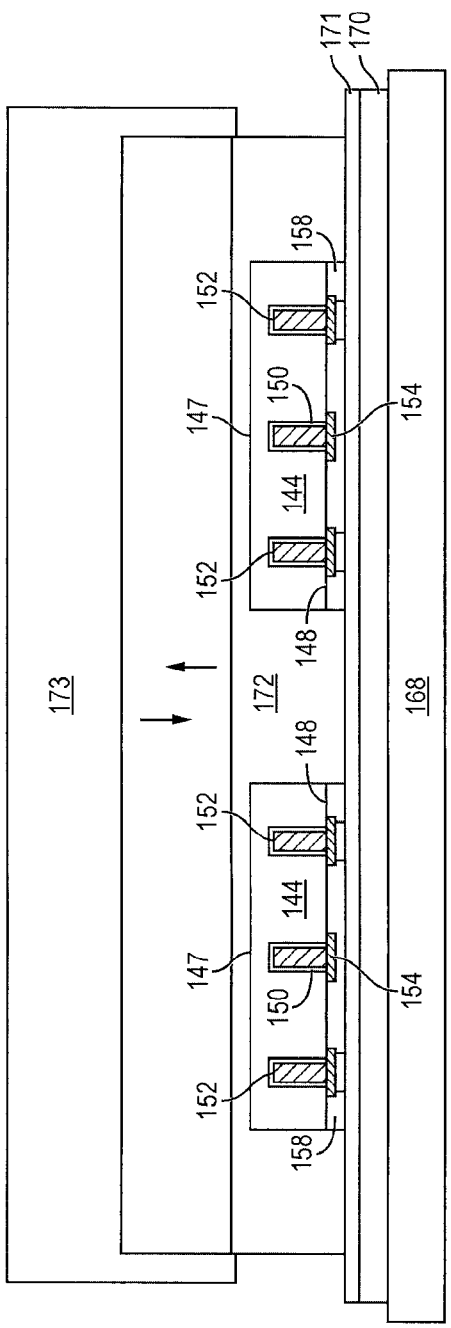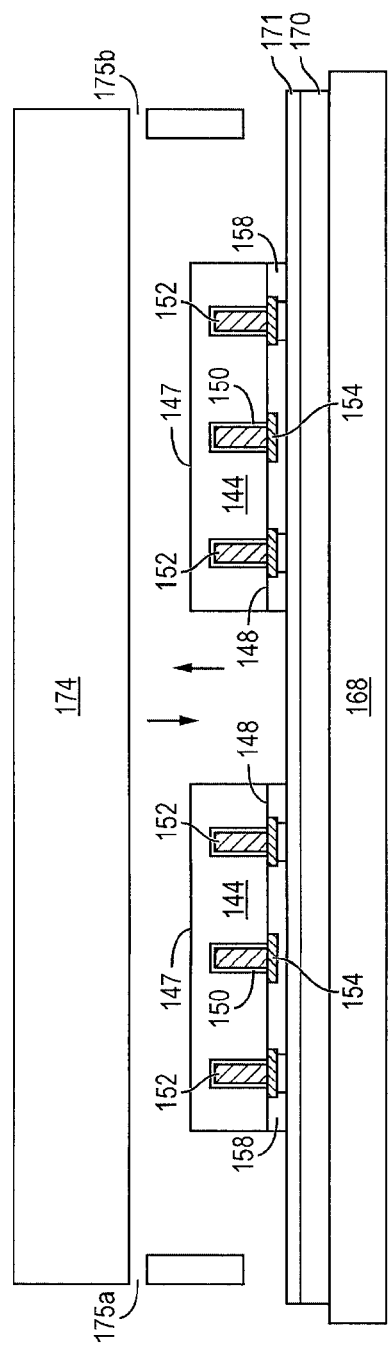

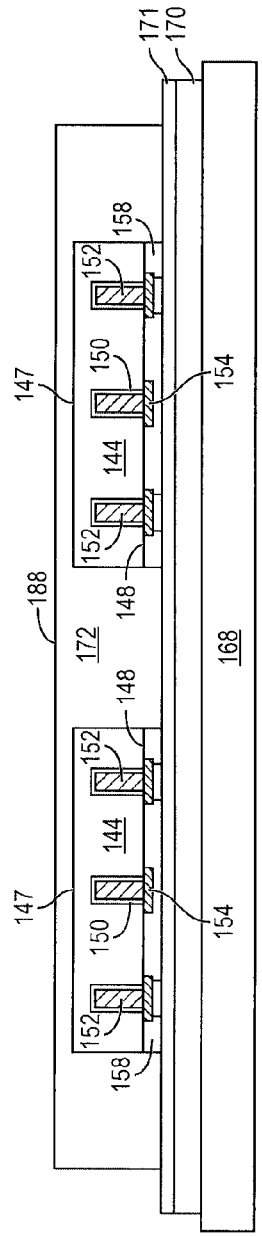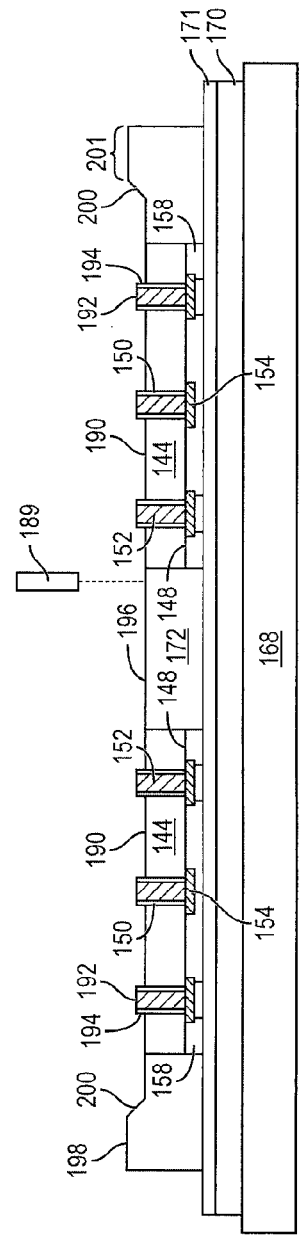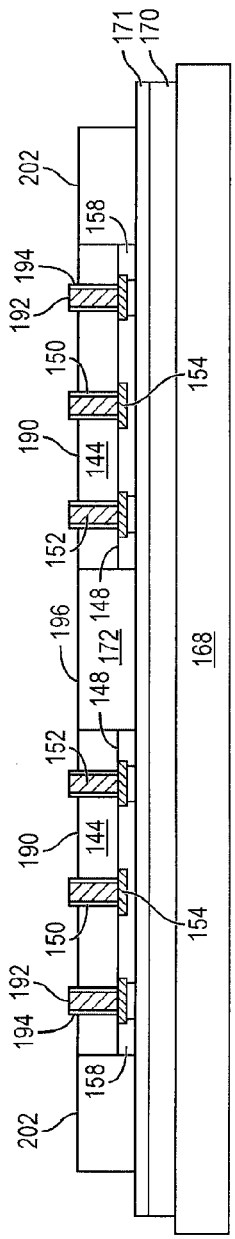

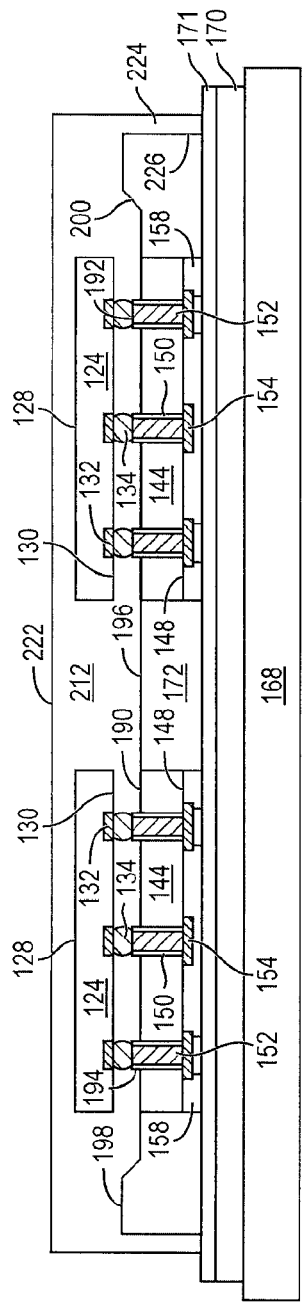
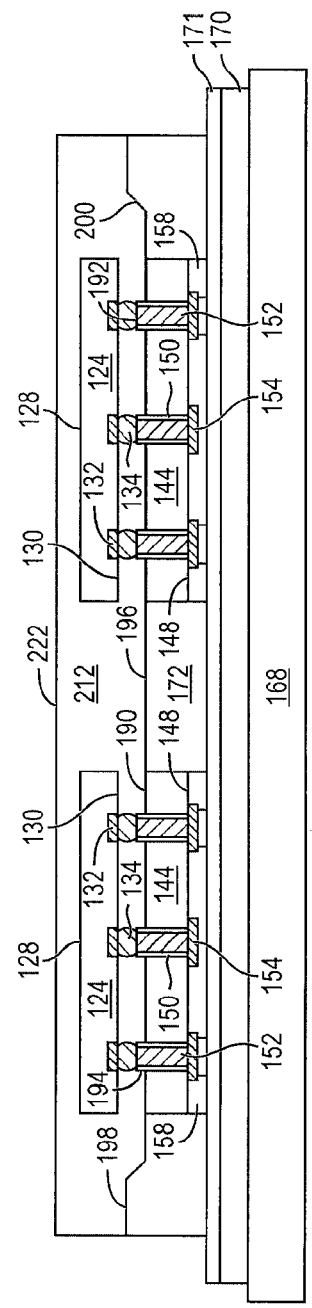
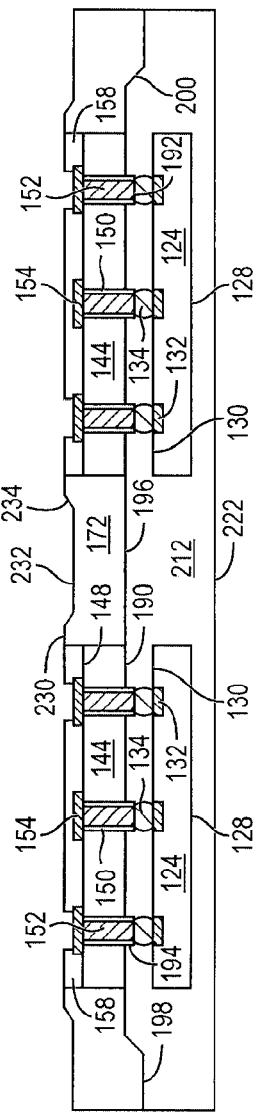
FIG. 5o
FIG. 5p
FIG. 5q

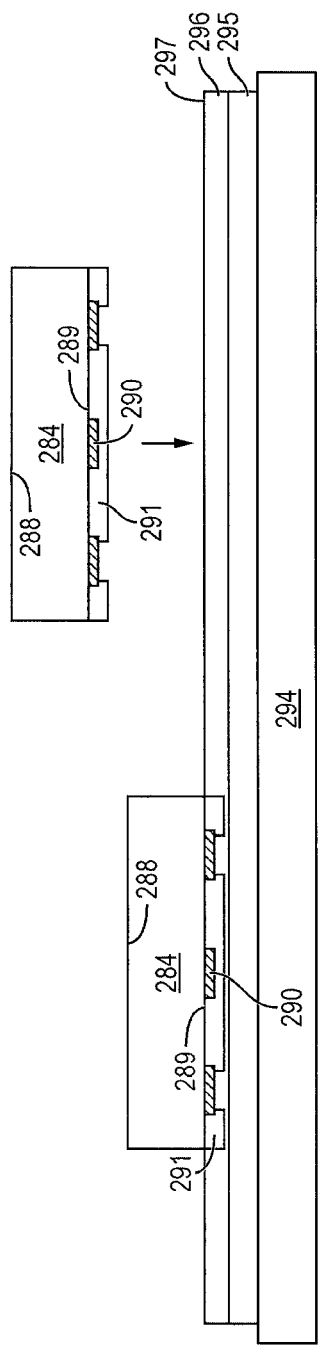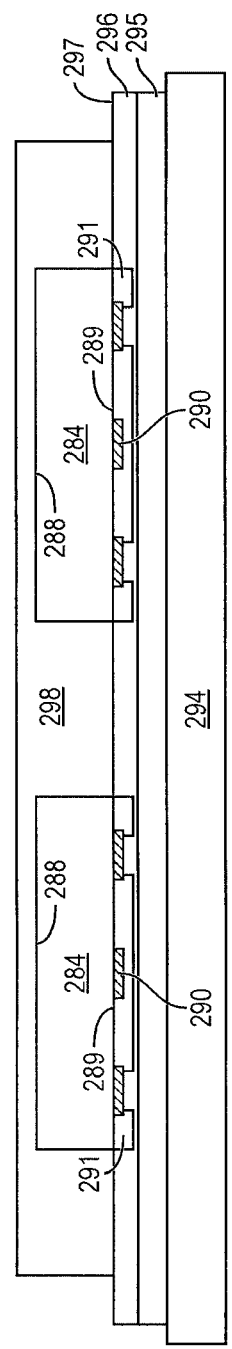

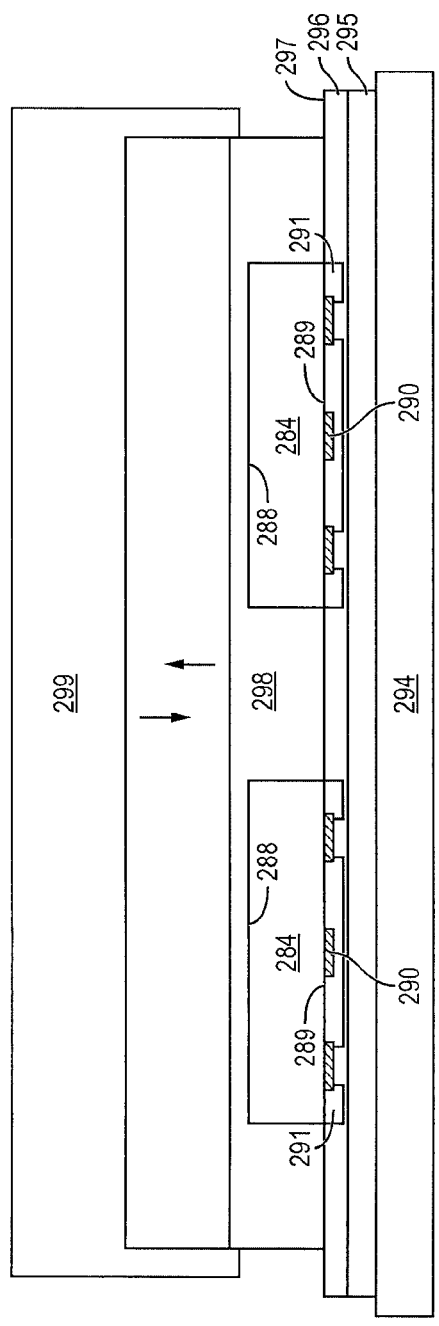
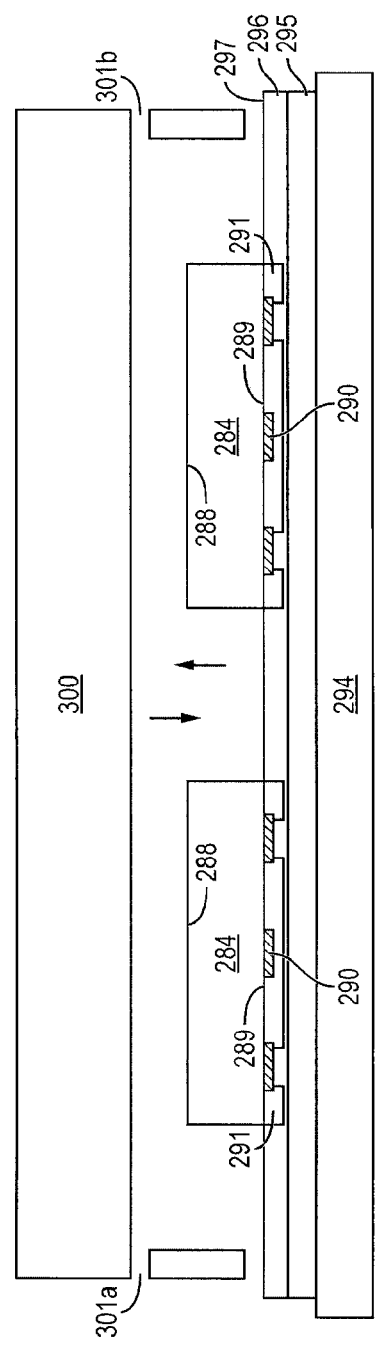

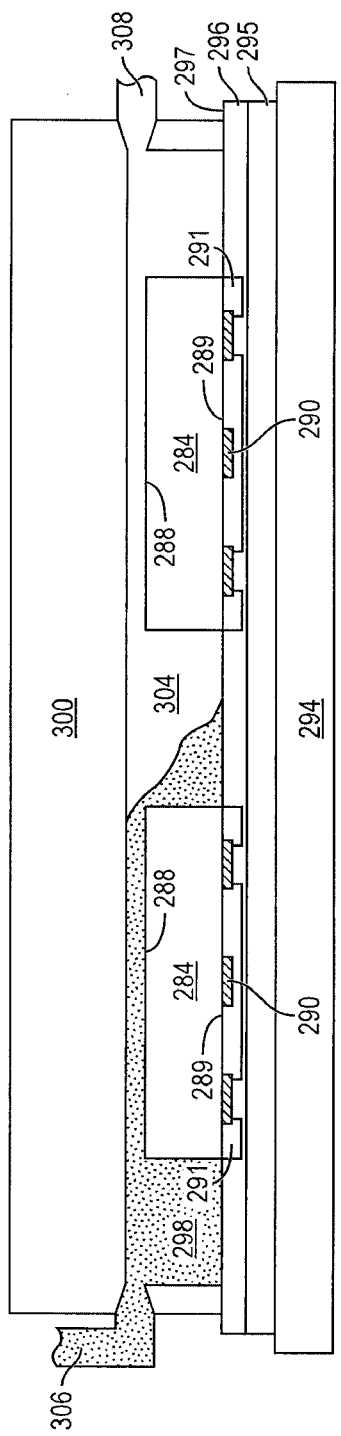
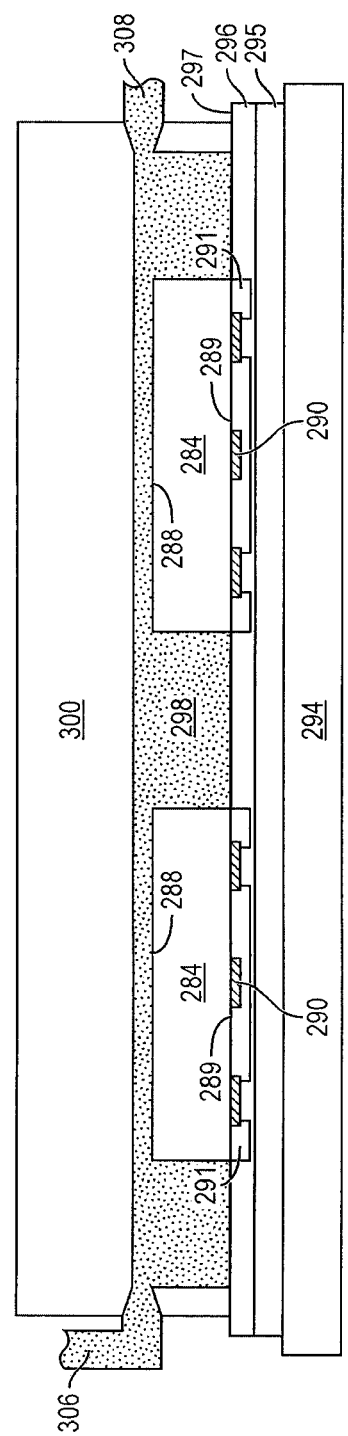
FIG. 8f
FIG. 8g

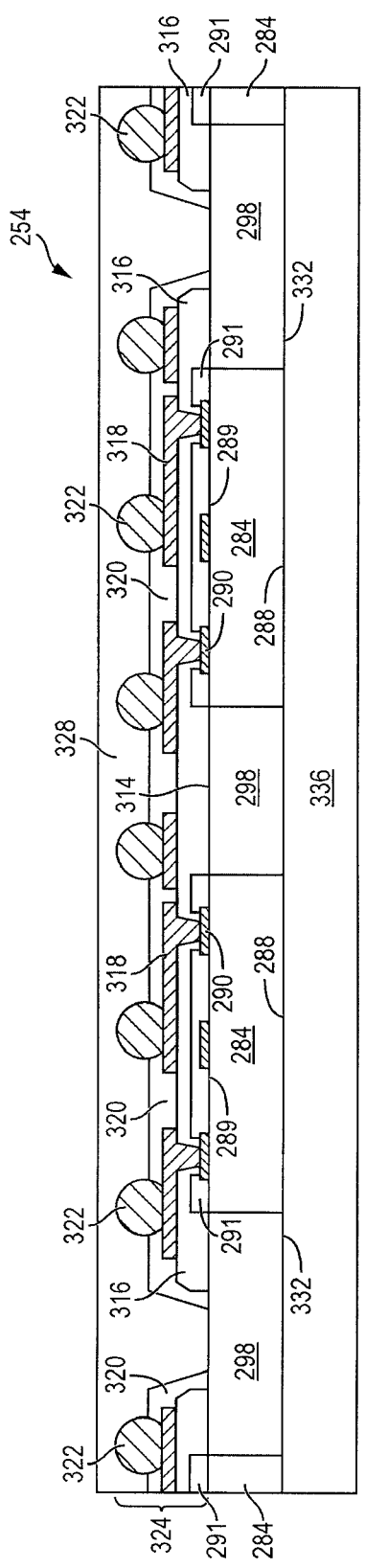
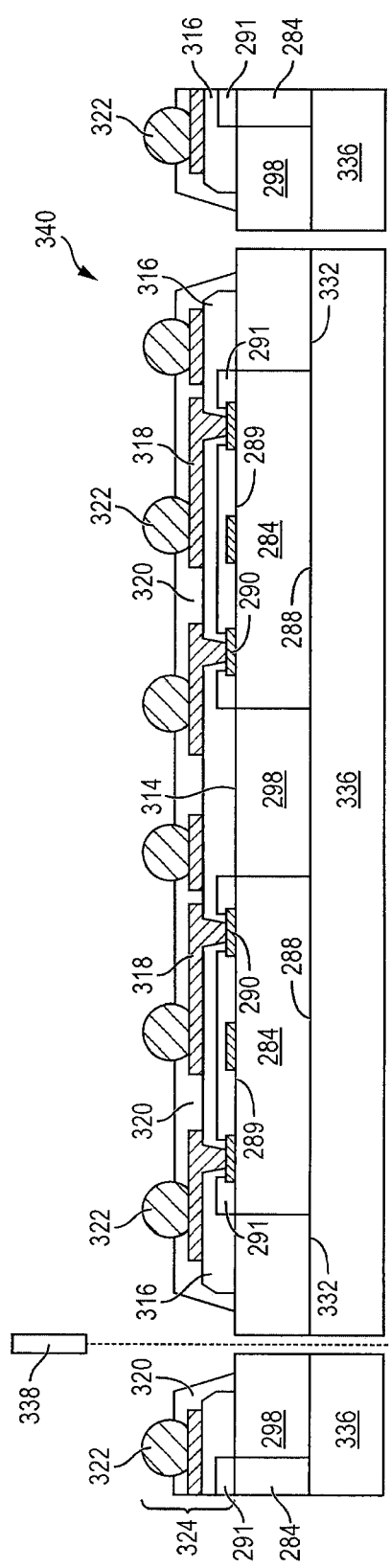
FIG. 8m
FIG. 8n

US 8,648,470 B2

SEMICONDUCTOR DEVICE AND METHOD OF FORMING FO-WLCSP WITH MULTIPLE ENCAPSULANTS

CLAIM TO DOMESTIC PRIORITY

The present application claims the benefit of U.S. Provisional Application No. 61/435,229, filed Jan. 21, 2011, and claims priority to the above application pursuant to 35 U.S.C. 119(e).

FIELD OF THE INVENTION

The present invention relates in general to semiconductor devices and, more particularly, to a semiconductor device and method of forming fan out wafer level chip scale packages (Fo-WLCSPs) with multiple encapsulants.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CODs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce reliable devices. Reliability of semiconductor devices is reduced, for example, by excessive warpage of semiconductor device components and packaging at both the wafer level and at the package level. Excessive warpage, including the warpage of substrates, encapsulants, and redistribution layers (RDLs) can interfere with electrical function and interconnection of semiconductor devices thereby reducing reliability and overall device performance.

SUMMARY OF THE INVENTION

A need exists for warpage control in fan-out WLCSPs. Accordingly, in one embodiment, the present invention is a method of making a semiconductor device comprising the steps of providing a carrier with a thermally releasable layer, mounting a first semiconductor die including through silicon vias (TSVs) to the thermally releasable layer, depositing a first encapsulant having a first coefficient of thermal expansion (CTE) over the first semiconductor die, exposing a surface of the TSVs, mounting a second semiconductor die to the surface of the TSVs, depositing a second encapsulant having a second CTE over the first semiconductor die and second semiconductor die, and forming an interconnect structure over the first and second semiconductor die.

In another embodiment, the present invention is a method of making a semiconductor device comprising the steps of providing a carrier, mounting a first semiconductor die including TSVs to the carrier, depositing a first encapsulant having a first CTE over the first semiconductor die, exposing a surface of the TSVs, mounting a second semiconductor die to the surface of the TSVs, and depositing a second encapsulant having a second CTE over the first semiconductor die and second semiconductor die.

In another embodiment, the present invention is a method of making a semiconductor device comprising the steps of providing a carrier, mounting a first semiconductor die over the carrier, depositing a first encapsulant having a first CTE over the first semiconductor die, and depositing a second encapsulant having a second CTE over the first semiconductor die and first encapsulant.

In another embodiment, the present invention is a semiconductor device comprising a first semiconductor die including TSVs. A first encapsulant having a first CTE is formed over the first semiconductor die. A second semiconductor die is mounted to the TSVs. A second encapsulant having a second CTE is formed over the first semiconductor die and second semiconductor die.

BRIEF DESCRIPTION OF THE DRAWINGS

FIGS. 4a-4d illustrate a semiconductor wafer with a plurality of semiconductor die including blind TSVs separated by saw streets;

DETAILED DESCRIPTION OF THE DRAWINGS

Figure 1:
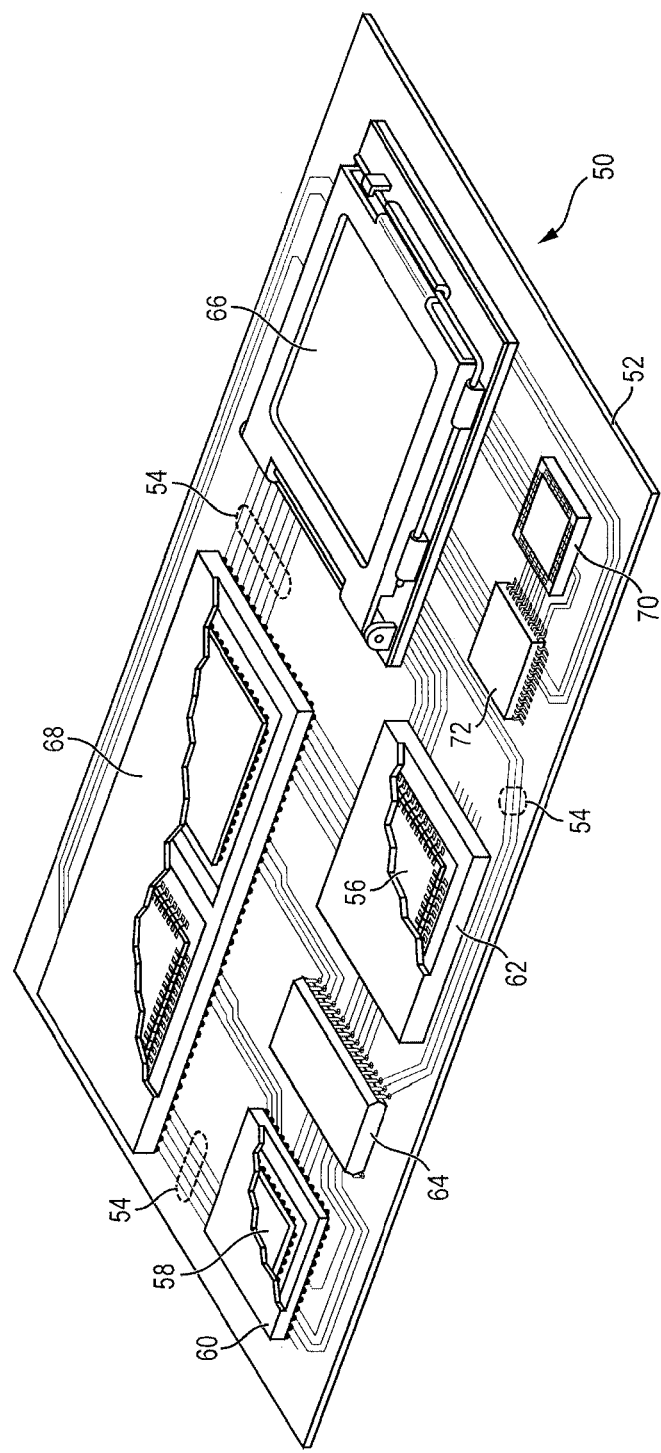
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
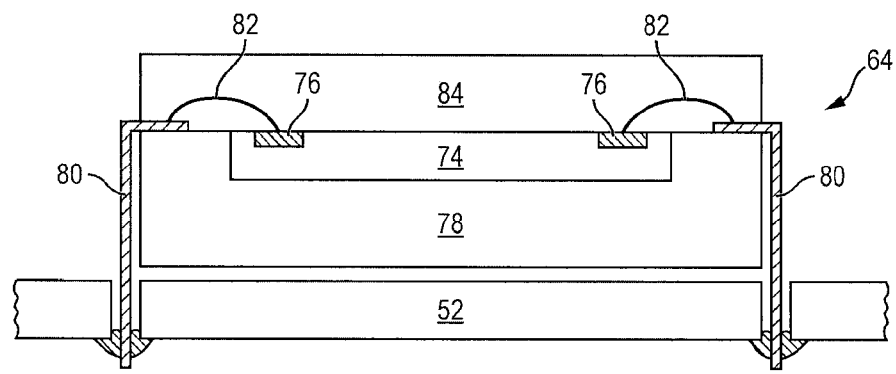
FIGS. 2a-2c illustrate further detail of the representative semiconductor packages mounted to the PCB.
Figure 2B:
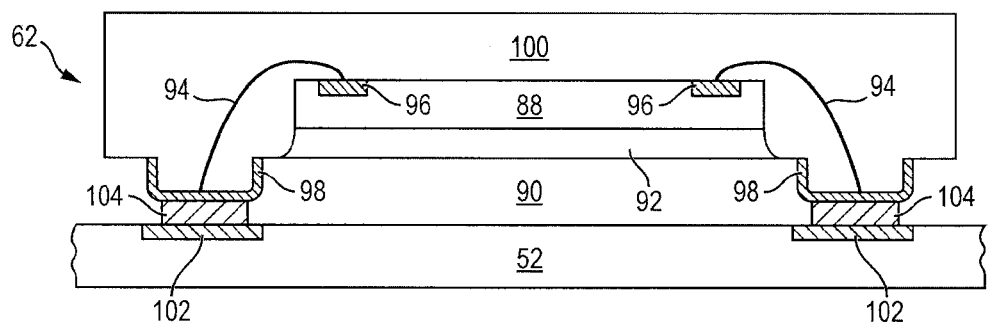
Figure 2C:
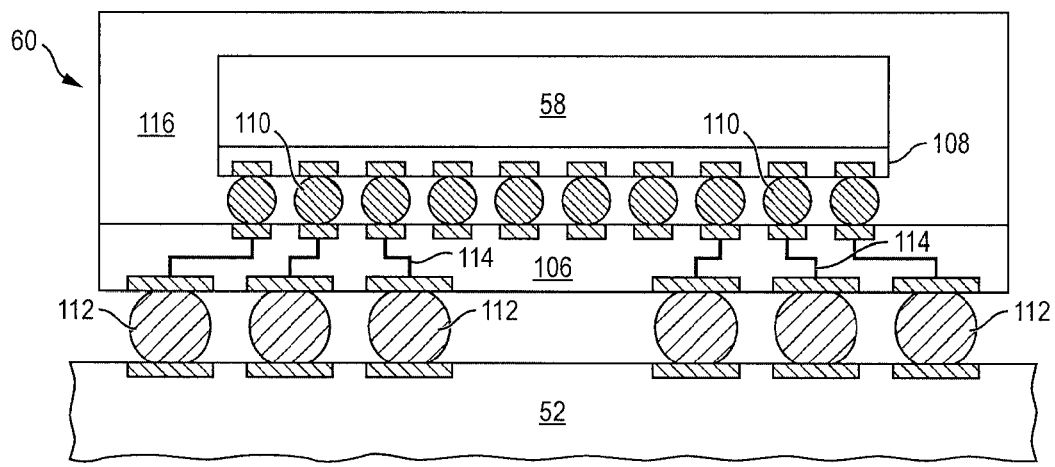

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
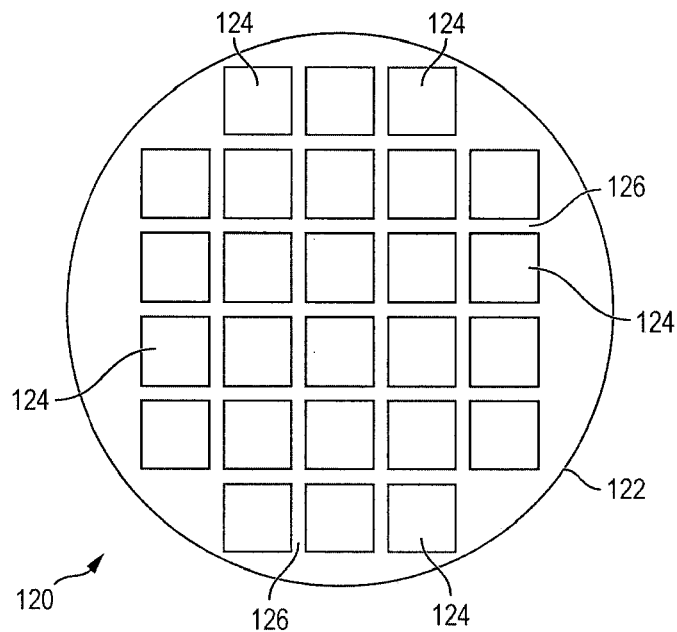
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
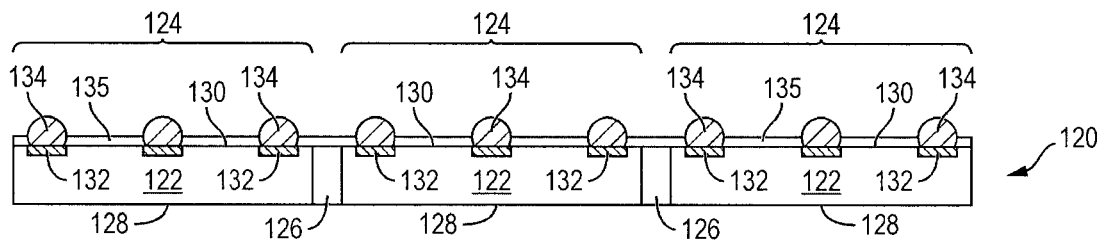

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An electrically conductive bump material is deposited over conductive layer 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 132 using a suitable attachment or bonding process. In one embodiment, the bump material is reflowed by heating the material above its melting point to form balls or bumps 134. In some applications, bumps 134 are reflowed a second time to improve electrical contact to conductive layer 132. Bumps 134 can also be compression bonded or thermocompression bonded to conductive layer 132. Bumps 134 represent one type of interconnect structure that can be formed over conductive layer 132. The interconnect structure can also use stud bump, micro bump, conductive column or pillar, or other electrical interconnect.

In one embodiment, an optional non-conductive film (NCF) or non-conductive paste (NCP) 135 is applied over active surface 130 of semiconductor wafer 120 using spin coating, lamination, or other suitable process. NCF 135 includes epoxy, epoxy-resin adhesive material, polymeric materials, films, or other non-conductive materials. NCF 135 is applied before semiconductor wafer 120 is singulated. When semiconductor die 124 is subsequently mounted to a substrate or semiconductor device, NCF 135 operates as an underfill material for filling a space between active surface 130 and the substrate or semiconductor device. NCF 135 further assists in wetting processes associated with mounting semiconductor die 124 to a substrate or semiconductor device.

Figure 3C:
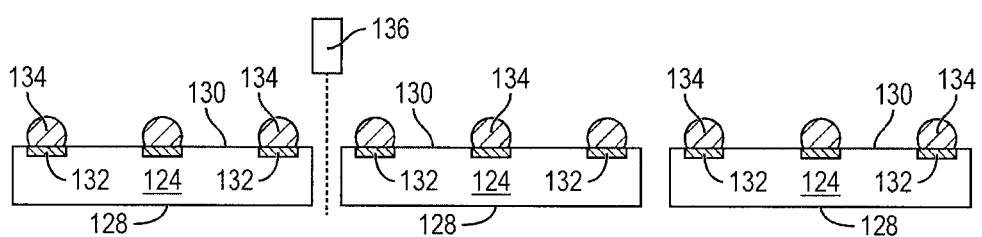

In FIG. 3c, semiconductor wafer 120 is singulated through saw street 126 using a saw blade or laser cutting tool 136 into individual semiconductor die 124.

FIG. 4a shows a semiconductor wafer 140 with a base substrate material 142, such as silicon, germanium, gallium arsenide, indium phosphide, or silicon carbide, for structural support. A plurality of semiconductor die or components 144 is formed on semiconductor wafer 140 separated by a non-active, inter-die wafer area or saw street 146 as described above. Saw street 146 provides cutting areas to singulate semiconductor wafer 140 into individual semiconductor die 144.

FIG. 4b shows a cross-sectional view of a portion of semiconductor wafer 140. Each semiconductor die 144 has a back surface 147 and active surface 148 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 148 to implement analog circuits or digital circuits, such as DSP, ASIC, memory, or other signal processing circuit. Semiconductor die 144 may also contain IPDs, such as inductors, capacitors, and resistors, for RF signal processing. A plurality of vias 149 is formed in semiconductor wafer 140 using laser drilling, mechanical drilling, deep reactive ion etching (DRIE), or laser ablation. Vias 149 extend from active surface 148 partially but not completely through semiconductor wafer 140 and facilitate the subsequent formation of blind TSVs. A location and number of vias 149 is formed according to the configuration and design of semiconductor die 144.

FIG. 4b further shows an insulating or passivation layer 150 is formed in vias 149. Insulating layer 150 is conformally applied to sidewalls and a bottom surface of vias 149 using PVD, CVD, screen printing, spin coating, spray coating, sintering or thermal oxidation. Insulating layer 150 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. Insulating layer 150 provides electrical isolation for subsequently formed TSVs that are formed in vias 149.

Figure 4C:
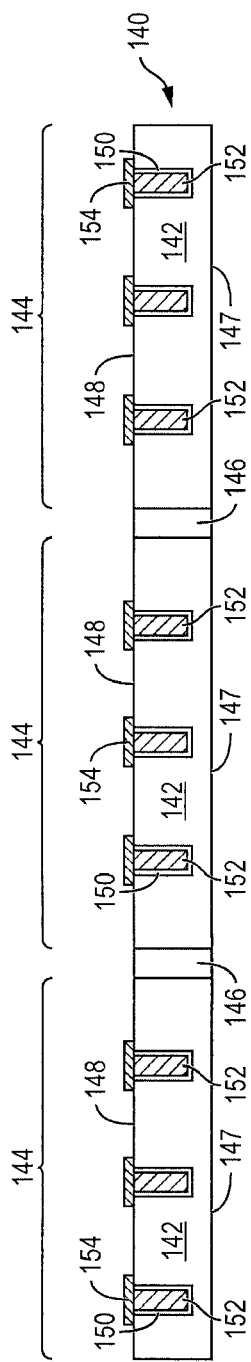

In FIG. 4c, vias 149 are filled with one or more layers of Al, Cu, Sn, Ni, Au, Ag, titanium (Ti), tungsten (W), poly-silicon, or other suitable electrically conductive material using electrolytic plating, electroless plating process, or other suitable metal deposition process to form vertical z-direction blind TSVs 152. Blind TSVs 152 extend from active surface 148 partially but not completely through semiconductor wafer 140. Blind TSVs 152 provide for subsequent vertical electrical interconnection between active surface 148 of semiconductor die 144 and an opposing surface of the semiconductor die as well as electrical interconnection with additional semiconductor die and points external to the completed Fo-WLCSP. A location and number of blind TSVs 152 is formed according to the configuration and design of semiconductor die 144.

FIG. 4c also shows an electrically conductive layer 154 is formed over active surface 148 and blind TSVs 152 using PVD, CVD, electrolytic plating, electroless plating process, or other suitable metal deposition process. Conductive layer 154 can be one or more layers of Al, Cu, Sn, Ni, Au, Ag, or other suitable electrically conductive material. Conductive layer 154 operates as contact pads electrically connected to the circuits on active surface 148. Conductive layer 154 also electrically connect to blind TSVs 152 to facilitate vertical electrical interconnection between active surface 148 of semiconductor die 144 and an opposing surface of the semiconductor die. Conductive layer 154 can be formed as contact pads disposed side-by-side a first distance from the edge of semiconductor die 144, as shown in FIG. 4c. Alternatively, conductive layer 154 can be formed as contact pads that are offset in multiple rows such that a first row of contact pads is disposed a first distance from the edge of the die, and a second row of contact pads alternating with the first row is disposed a second distance from the edge of the die.

Figure 4D:
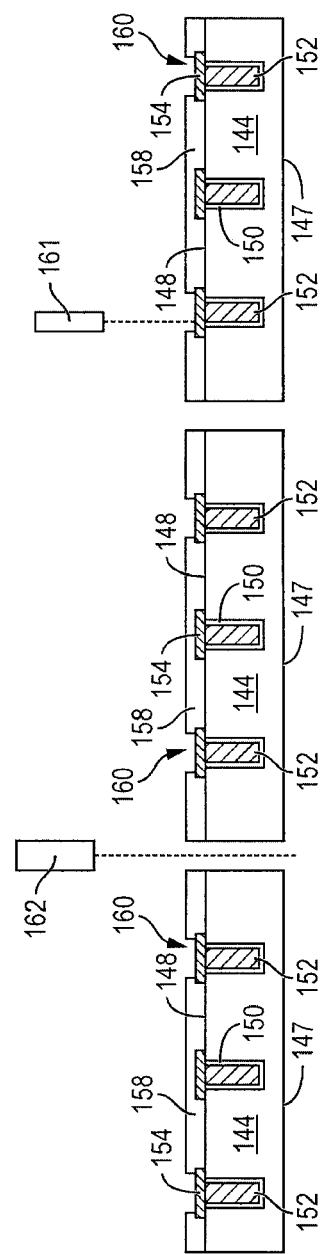

In FIG. 4d, an insulating or passivation layer 158 is formed over active surface 148 of semiconductor die 144, over blind TSVs 152, and over conductive layer 154 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching or other suitable process to form openings 160 which expose blind TSVs 152 and conductive layer 154 for subsequent electrical interconnect. In one embodiment, openings 160 are formed by laser direct ablation (LDA) using laser 161. Furthermore, semiconductor wafer 140 is singulated through saw street 146 using a saw blade or laser cutting tool 162 into individual semiconductor die 144.

Figure 5A:
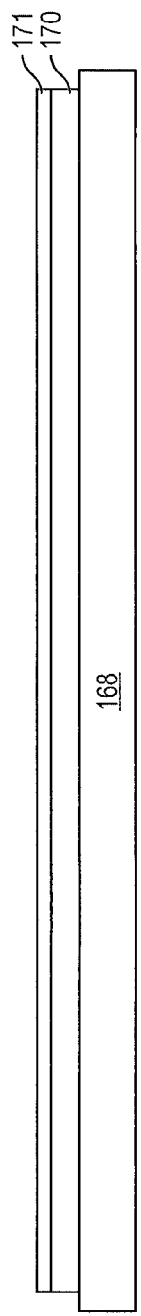
FIGS. 5a-5u illustrate a process of forming a Fo-WLCSP including stacked semiconductor die with TSVs and multiple encapsulants.
Figure 5B:
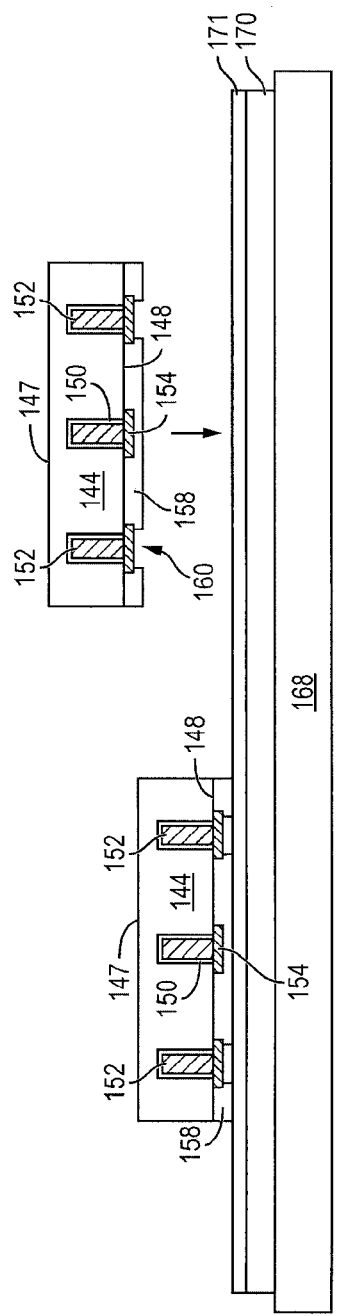
Figure 5C:
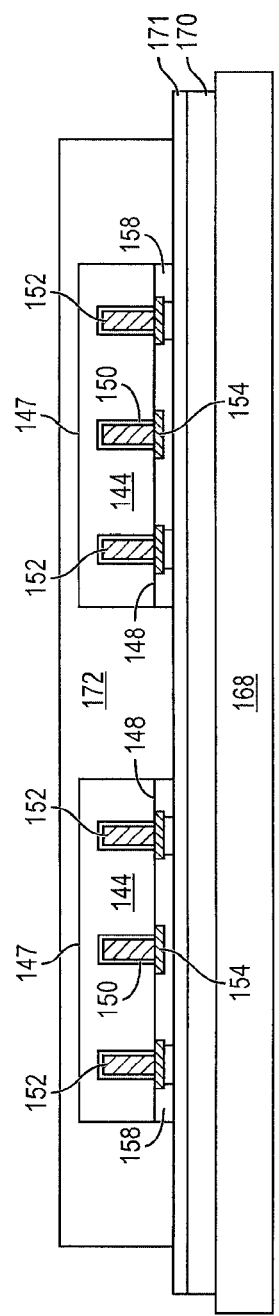
Figure 5F:
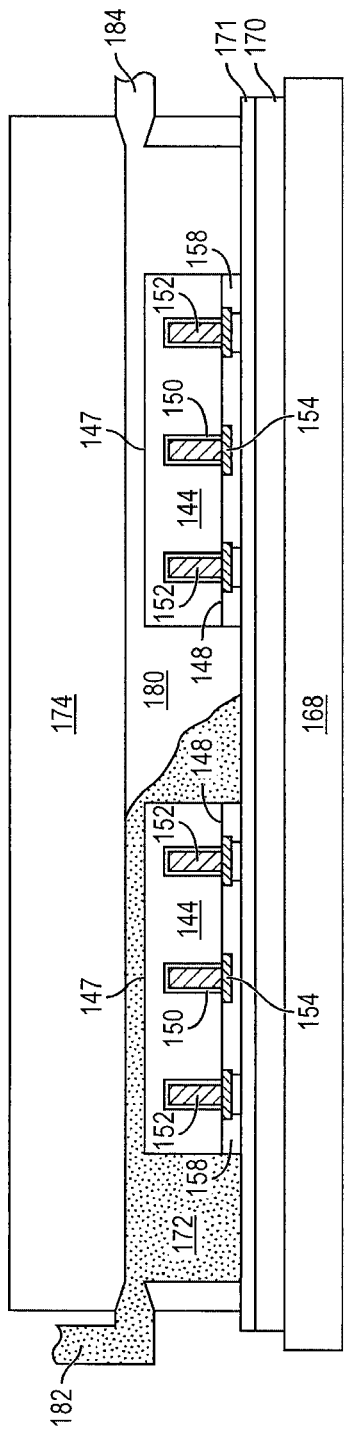
Figure 5G:
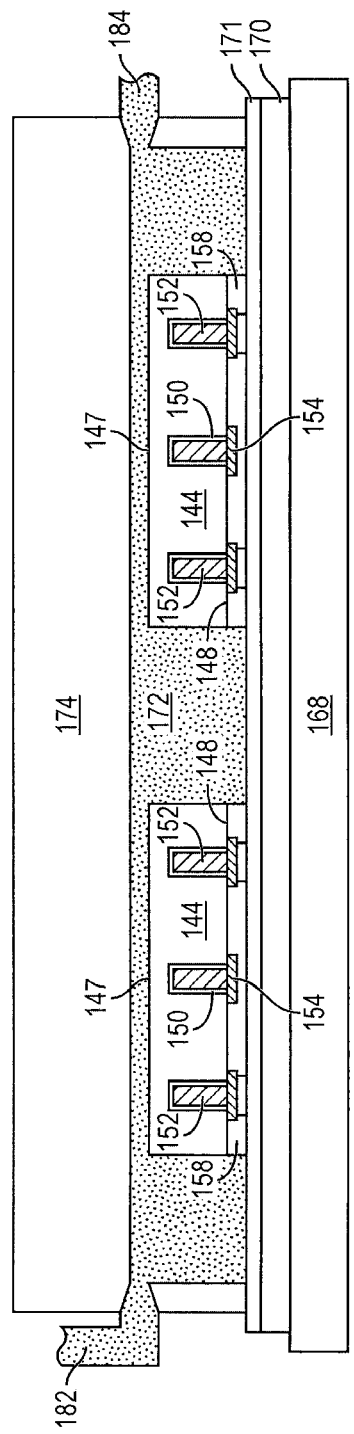
Figure 5K:
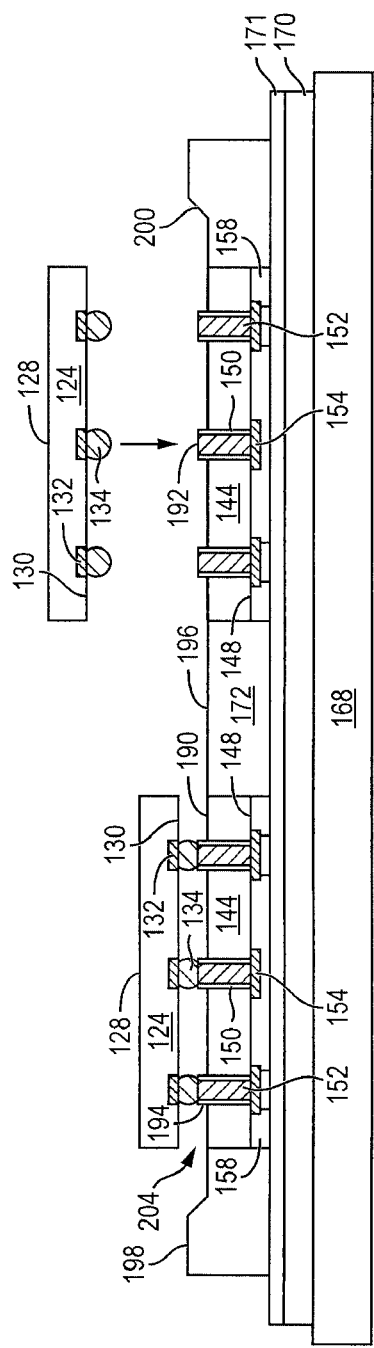
Figure 5L:
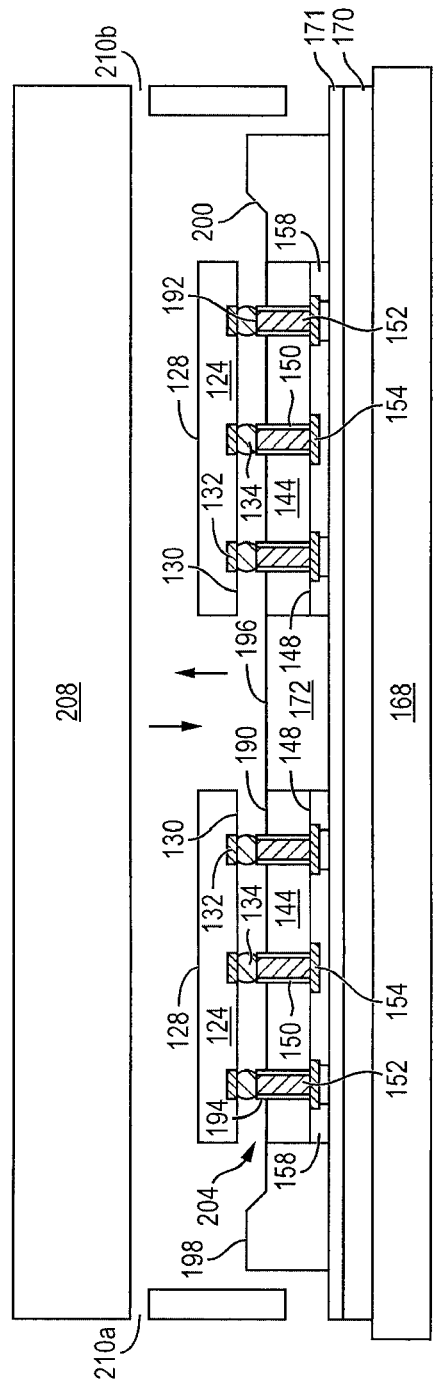
Figure 5M:
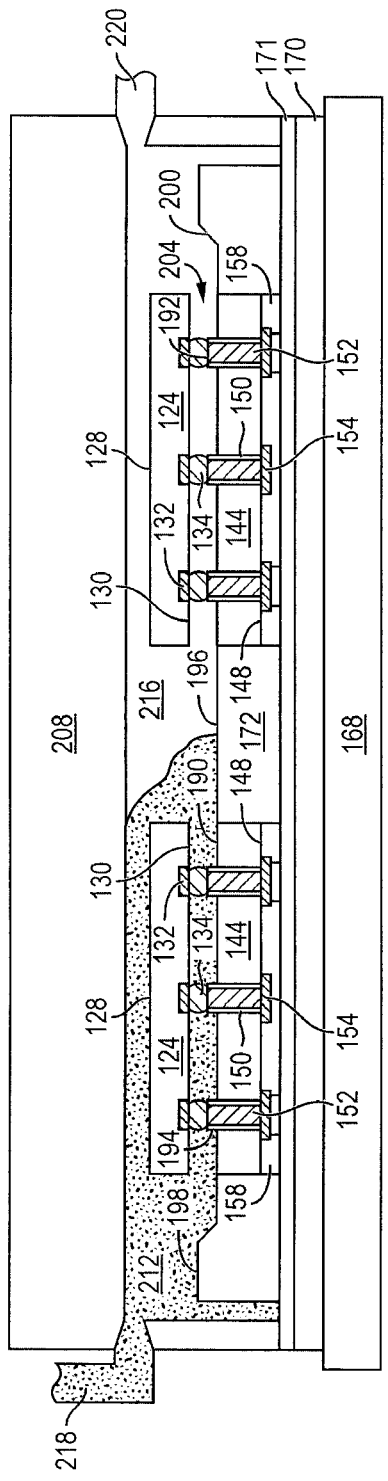
Figure 5N:
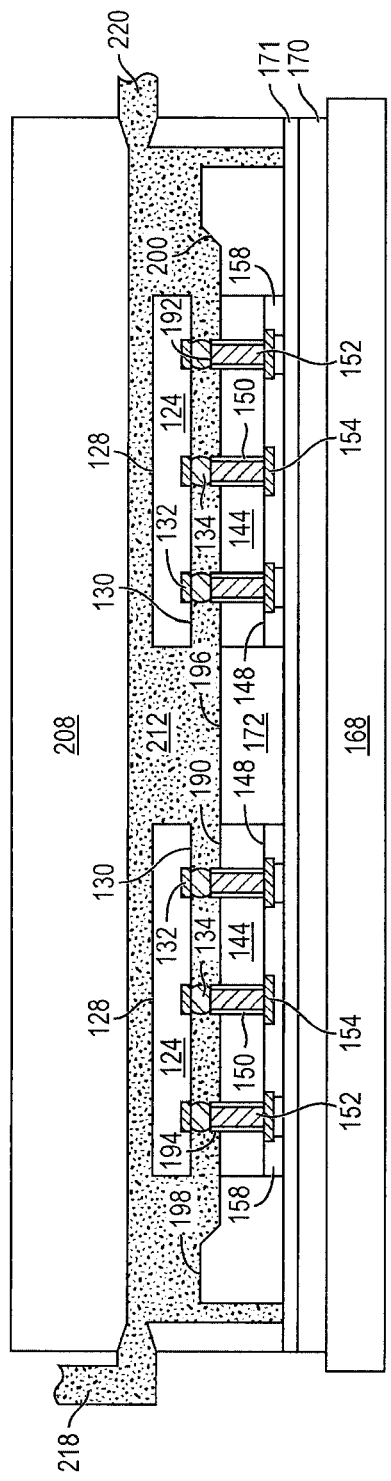
Figure 5R:
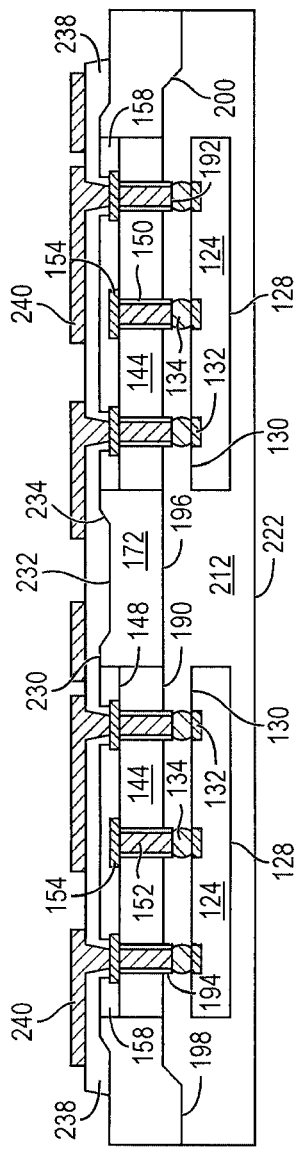
Figure 5S:
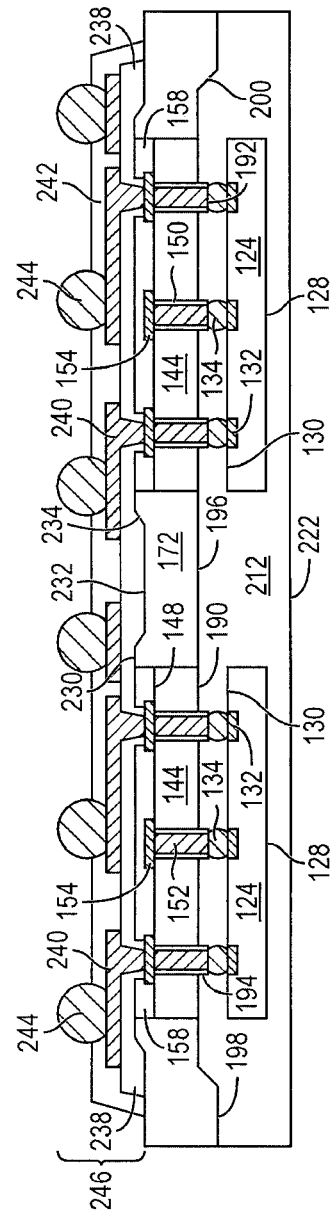
Figure 5T:
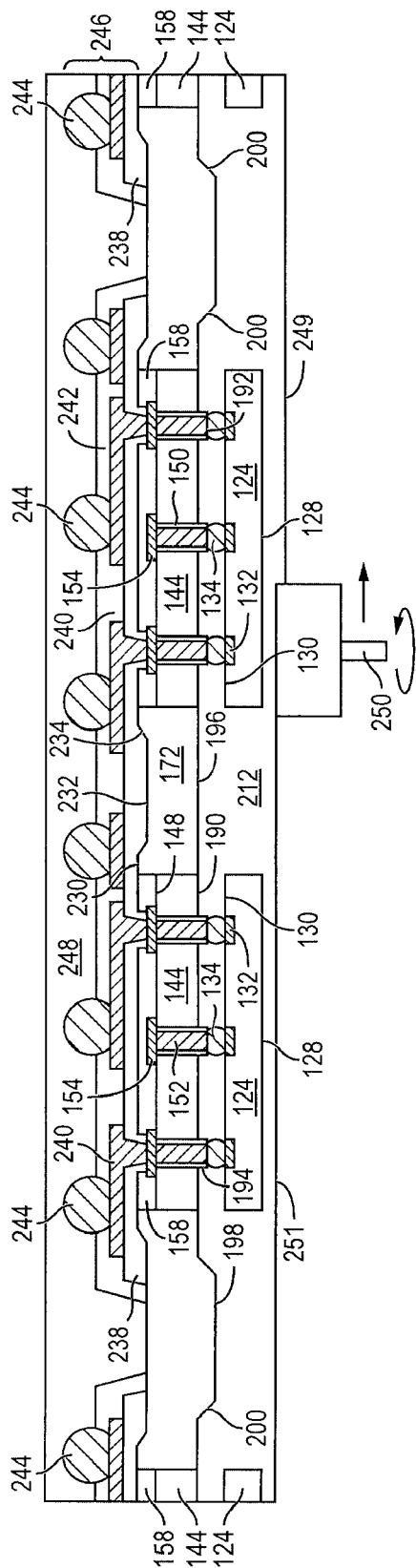
Figure 5U:
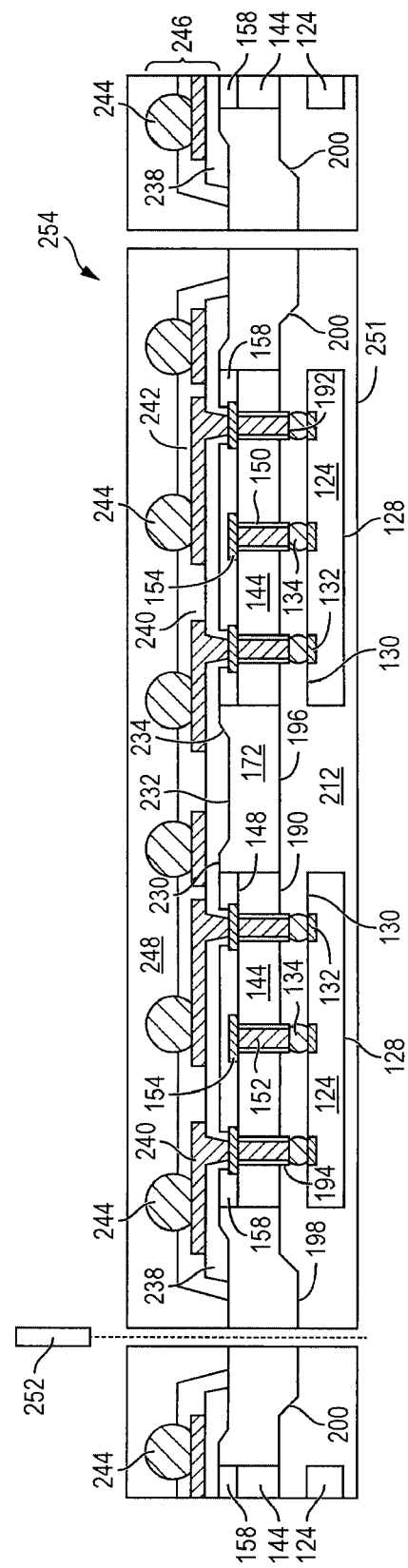

FIGS. 5a-5u illustrate, in relation to FIGS. 1 and 2a-2c, a process of forming a Fo-WLCSP with TSVs and dual encapsulants for balancing CTEs. FIG. 5a shows a cross sectional view of a portion of temporary substrate or carrier 168 containing sacrificial or recyclable base material such as silicon, steel, polymer, beryllium oxide, or other suitable low-cost, rigid material for structural support. An interface layer or carrier tape 170 is formed or laminated over carrier 168 as a temporary adhesive bonding film and support layer. A thermally releasable layer 171 is formed or laminated on carrier tape 170 and over carrier 168. Thermally releasable layer 171 is configured to receive later mounted semiconductor die 144 and to be removed after the formation of first and second encapsulating layers.

In FIG. 5b, semiconductor die 144 from FIGS. 4a-4d are positioned over carrier 168, carrier tape 170, and thermally releasable layer 171 with active surface 148 oriented toward the carrier. Semiconductor die 144 are mounted to carrier 168, carrier tape 170, and thermally releasable layer 171 as part of a reconstituted or reconfigured wafer level package.

FIG. 5c shows semiconductor die 144 are mounted to carrier 168, carrier tape 170, and thermally releasable layer 171. An encapsulant or molding compound 172 is pre-dispensed or laminated over carrier 168, carrier tape 170, thermally releasable layer 171, and around semiconductor die 144. Encapsulant 172 can be polymer composite material, such as epoxy resin with filler or fiber, epoxy acrylate with filler or fiber, or polymer with proper filler or fiber. In one embodiment, encapsulant 172 is selected to have a high CTE and a low filler or fiber content with respect to a subsequently selected encapsulant or molding compound. Semiconductor die 144 are embedded together in encapsulant 172 which is non-conductive and environmentally protects the semiconductor device from external elements and contaminants.

FIG. 5d shows chase mold 173 is brought together with carrier 168, carrier tape 170, and thermally releasable layer 171 to enclose semiconductor die 144 and encapsulant 172 within the mold for encapsulation. Chase mold 173 is brought together with carrier 168, carrier tape 170, and thermally releasable layer 171 by moving chase mold 173 around semiconductor die 144 and encapsulant 172, or alternatively, by moving the semiconductor die and encapsulant into the mold. In one embodiment, chase mold 173 includes only a first or top portion that is brought together with carrier 168, carrier tape 170, and thermally releasable layer 171 without a second or bottom mold portion. Carrier 168, carrier tape 170, and thermally releasable layer 171 serve as the bottom mold portion for the encapsulation process. Alternatively, semiconductor die 144, carrier 168, carrier tape 170, and thermally releasable layer 171 may be disposed within a mold including multiple portions, such as top and bottom portions. After semiconductor die 144 and encapsulant 172 are disposed within chase mold 173, the encapsulant can be partially or completely cured. After semiconductor die 144 are embedded within encapsulant 172 as a reconstituted wafer, the reconstituted wafer is removed from chase mold 173.

FIG. 5e, continuing from FIG. 5b, shows semiconductor die 144 are mounted to carrier 168, carrier tape 170, and thermally releasable layer 171. FIGS. 5e-5g, similar to FIGS. 5c and 5d, show an embodiment in which encapsulant 172 is deposited over carrier 168, carrier tape 170, thermally releasable layer 171, and around semiconductor die 144. Encapsulant 172 is deposited using a paste printing, compressive molding, transfer molding, liquid encapsulant molding, vacuum lamination, spin coating, or other suitable applicator. Specifically, FIG. 5e shows a chase mold 174 with a plurality of inlets 175a and 175b brought together with carrier 168, carrier tape 170, and thermally releasable layer 171 to enclose semiconductor die 144 within the mold for subsequent encapsulation. Chase mold 174 is brought together by moving chase mold 174 around semiconductor die 144, or alternatively, by moving the semiconductor die into the mold. Chase mold 174 includes only a first or top portion that is brought together with carrier 168, carrier tape 170, and thermally releasable layer 171 without a second or bottom mold portion. Carrier 168, carrier tape 170, and thermally releasable layer 171 serve as the bottom mold portion for the subsequent encapsulation process. Alternatively, semiconductor die 144, carrier 168, carrier tape 170, and thermally releasable layer 171 may be disposed within a mold including multiple portions, such as top and bottom portions.

FIG. 5f shows chase mold 174 encloses semiconductor die 144 with open space 180. Open space 180 extends between chase mold 174 to semiconductor die 144 and thermally releasable layer 171. Encapsulant 172, in a liquid state, is injected through inlet 175a into one side of chase mold 174 with nozzle 182 while an optional vacuum assist 184 draws pressure from the opposite side through inlet 175b to uniformly fill open space 180 with the encapsulant. The viscosity of encapsulant 172 is selected for uniform coverage, e.g., a lower viscosity increases the flow of the encapsulant for molding, paste printing, and spin coating. Semiconductor die 144 are embedded together in encapsulant 172 which is non-conductive and environmentally protects the semiconductor device from external elements and contaminants.

FIG. 5g shows encapsulant 172 has filled open space 180 between chase mold 174 and carrier 168, carrier tape 170, and thermally releasable layer 171. Encapsulant 172 is further disposed around semiconductor die 144.

FIG. 5h, continuing from FIG. 5d or 5g, shows semiconductor die 144 mounted to carrier 168, carrier tape 170, and thermally releasable layer 171 and embedded within encapsulant 172 as a reconstituted wafer after having been removed from chase mold 174. Encapsulant 172 is shown with a surface 188 of the encapsulant formed over back surface 147 of semiconductor die 144. Alternatively, encapsulant 172 is deposited coplanar with back surface 147 of semiconductor die 144 so that the back surface is exposed from the encapsulant.

In FIG. 5i, surface 188 of encapsulant 172 and a portion of semiconductor die 144 is removed. The removed portion of semiconductor die 144 extends from back surface 147 partially but not completely through the semiconductor die such that surface 190 of the semiconductor die is exposed. The removed portions of semiconductor die 144 and encapsulant 172 further expose a bottom surface 192 of conductive TSVs 152 and sidewalls 194. Sidewalls 194 are an exposed portion of conductive TSVs 152 or an exposed portion of insulating layer 150. Surface 188 of encapsulant 172 and the portion of semiconductor die 144 are removed by mechanical grinding followed by an etching process, CMP, LDA with laser 189, or other suitable process while mounted over carrier 168. In one embodiment, a back grinding and plasma etch process with high selectivity is used to remove surface 188 of encapsulant 172 and a portion of semiconductor die 144 to expose bottom surface 192 and sidewalls 194 of TSVs 152. The exposed sidewalls provide a vertical offset between bottom surface 192 of TSVs 152 and surface 190 of semiconductor die 144. In one embodiment, bottom surface 192 of TSVs 152 protrudes from surface 190 a distance of 0.5-10 micrometers (μm).

The removal of surface 188 of encapsulant 172 extends from surface 188 partially but not completely through the encapsulant to expose surface 196. In one embodiment, the removal of encapsulant 172 thins the reconstituted wafer while semiconductor die 144 and encapsulant 172 are mounted to carrier 168. Surface 196 of encapsulant 172 is substantially coplanar with surface 190 of semiconductor die 144. A peripheral portion of encapsulant 172 is formed as a thicker edge ring or elevated portion 198. Elevated portion 198 is formed by removing less of encapsulant 172 in the periphery of the encapsulant at an edge of the reconstituted wafer, thereby forming elevated portion 198 adjacent to surface 196 during the removal process. Elevated portion 198 is vertically offset from surface 196, and is connected to surface 196 by connecting portion 200. Connecting portion 200 is vertical or tapered. In one embodiment, elevated portion 198 is vertically offset from surface 196 by a distance substantially equal to or greater than 50 μm. The additional thickness of encapsulant 172 that forms elevated portion 198 provides increased strength to the reconstituted wafer and controls overall substrate warpage and reduces a risk of delamination of semiconductor die 144 and encapsulant 172 from carrier 168. In one embodiment, elevated portion 198 has a width 201 in a range of 3.0-10.0 millimeters (mm).

FIG. 5j shows another embodiment similar to that shown in FIG. 5i. FIG. 5j differs from FIG. 5i by the omission of elevated portion 198. In FIG. 5j, surface 188 of encapsulant 172 outside a footprint of semiconductor die 144 is removed by a mechanical grinding process followed by an etching process, CMP, LDA, or other suitable process while mounted over carrier 168. The removed portion extends from surface 188 partially but not completely through the encapsulant to expose surface 196. The removal of encapsulant 172 thins the reconstituted wafer while semiconductor die 144 and encapsulant 172 are mounted to carrier 168. Surface 196 of encapsulant 172 is substantially coplanar with surface 190 of semiconductor die 144 from a periphery of the semiconductor die extending to perimeter portion 202 of encapsulant 172. In one embodiment, a back grinding and plasma etch process with high selectivity is used to remove surface 188 of encapsulant 172 to expose surface 196 and perimeter portion 202 of the encapsulant.

In FIG. 5k, continuing from FIG. 5i, semiconductor die 124 from FIGS. 3a-3c are positioned over semiconductor die 144 and carrier 168 with active surface 130 oriented toward the carrier. Bumps or pillars 134 of semiconductor die 124 are aligned with and mounted to bottom surfaces 192 of TSVs 152 as part of a reconstituted or reconfigured wafer level package using a suitable bonding process such as physical mounting, thermal bonding, or ultrasonic bonding. By mounting semiconductor die 124 to bottom surface 192 of TSVs 152, a vertical offset or gap 204 is formed between active surface 130 and surface 190. When optional NCF 135 from FIG. 3b is used, the NCF operates as an underfill material for filling gap 204. NCF 135 further assists in wetting processes associated with mounting semiconductor die 124 to TSVs 152. Gap 204 is of sufficient size that when NCF 135 is not used, a subsequently formed encapsulant is disposed in the gap alleviating a need for disposing a separate or additional under fill material in gap 204. After mounting semiconductor die 124 with bumps 134 to TSVs 152, the reconstituted wafer including the semiconductor die undergoes an optional reflow process to improve a connection between bumps 134 and TSVs 152. Thus, semiconductor die 124 are fully connected with TSVs 152. Alternatively, semiconductor die 124 are bonded with bumps 134 to TSVs 152 without the reconstituted wafer undergoing the reflow process. After connecting semiconductor die 124 to TSVs 152, partial delamination among carrier 168, carrier tape 170, thermally releasable layer 171, and encapsulant 172 may be present. However, the presence of the partial delamination does not necessarily pose a problem for subsequent manufacturing steps.

FIG. 5*l* shows semiconductor die 124 are mounted to semiconductor die 144, over carrier 168, over carrier tape 170, over thermally releasable layer 171, and over encapsulant 172. FIG. 5*l* further shows chase mold 208 having a plurality of inlets 210*a* and 210*b* is brought together with carrier 168, carrier tape 170, and thermally releasable layer 171 to enclose semiconductor die 124, encapsulant 172, and semiconductor die 144 within the mold for subsequent encapsulation. Alternatively, chase mold 208 may be configured without inlets 210*a* and 210*b* when used for compressive molding or vacuum lamination of a predispensed molding compound or pre-laminated encapsulant sheet that is disposed over carrier 168, around semiconductor die 124, on surfaces 190, 196, 198, and on connecting portion 200, similar to the process shown in FIGS. 5*c* and 5*d*. In FIG. 5*l*, chase mold 208 is brought together with carrier 168, carrier tape 170, and thermally releasable layer 171 by moving chase mold 208 around semiconductor die 124, or alternatively, by moving the semiconductor die into the mold. In one embodiment, chase mold 208 includes only a first or top portion that is brought together with carrier 168, carrier tape 170, and thermally releasable layer 171 without a second or bottom mold portion. Carrier 168, carrier tape 170, and thermally releasable layer 171 serve as the bottom mold portion for the subsequent encapsulation process. Alternatively, semiconductor die 144, carrier 168, carrier tape 170, and thermally releasable layer 171 may be disposed within a mold including multiple portions, such as top and bottom portions.

In FIG. 5*m*, an encapsulant or molding compound 212 is deposited around semiconductor die 124, over carrier 168, over carrier tape 170, over thermally releasable layer 171, over encapsulant 172, and into gap 204 using a paste printing, compressive molding, transfer molding, liquid encapsulant molding, vacuum lamination, spin coating, or other suitable applicator. Encapsulant 212 can be polymer composite material, such as epoxy resin with filler or fiber, epoxy acrylate with filler or fiber, or polymer with proper filler or fiber. The viscosity of encapsulant 212 is selected for uniform coverage, e.g., a lower viscosity increases the flow of the encapsulant for molding, paste printing, and spin coating. Semiconductor die 124 are fully embedded together in encapsulant 212 which is non-conductive and environmentally protects the semiconductor die from external elements and contaminants. In one embodiment, encapsulant 212 is selected to have a low CTE and a high filler or fiber content with respect to encapsulant 172. The CTE and filler or fiber of encapsulant 212 is selected to balance and control the overall warpage of the reconstituted wafer. Balancing the effective CTEs of encapsulants 172 and 212 provide improved warpage control with respect to use of a single encapsulant at both the wafer level and for individual WLCSPs. Balancing the effective CTEs of encapsulants 172 and 212 further reduces warpage which improves the subsequent formation of RDLs and improves performance in reliability tests.

In one embodiment, an encapsulant 212 is deposited around semiconductor die 124, over carrier 168, over carrier tape 170, over thermally releasable layer 171, over encapsulant 172, and into gap 204 with a chase mold process. Chase mold 208 is brought together with carrier 168 to enclose semiconductor die 124 with open space 216. Alternatively, chase mold 208 has an upper mold support and lower mold support that are brought together to enclose semiconductor die 124 and carrier 168 with open space 216. A size of chase mold 208 may have a size that is substantially similar to a size of chase mold 208 such that a size of encapsulant 212 is substantially similar to a size of encapsulant 172. Encapsulant 212 in a liquid state is injected through inlet 210*a* into one side of chase mold 208 with nozzle 218 while an optional vacuum assist 220 draws pressure from the opposite side through inlet 210*b* to uniformly fill open space 216 around semiconductor die 124 and carrier 168 with the encapsulant material. Encapsulant 212 can be polymer composite material, such as epoxy resin with filler or fiber, epoxy acrylate with filler or fiber, or polymer with proper filler or fiber. In one embodiment, encapsulant 212 is selected to have a low CTE and a high filler or fiber content with respect to encapsulant 172.

FIG. 5*n* shows encapsulant 212 has filled open space 216 between chase mold 208 and carrier 168, carrier tape 170, thermally releasable layer 171, and encapsulant 172. Encapsulant 212 is further disposed around semiconductor die 124, and in gap 204.

FIG. 5*o* shows semiconductor die 124 removed from chase mold 208 and mounted to carrier 168 while embedded within encapsulant 212. Encapsulant 212 is shown with a surface 222 of the encapsulant formed over back surface 128 of semiconductor die 124. Alternatively, encapsulant 212 is deposited coplanar with back surface 128 of semiconductor die 124 so that the back surface is exposed from the encapsulant. When the size of chase mold 208 and encapsulant 212 is greater than the size of chase mold 174 and encapsulant 172, a peripheral portion 224 of encapsulant 212 is formed adjacent to, and covers a side portion 226 of encapsulant 172. Peripheral portion 224 extends from surface 222 to carrier tape 170 and thermally releasable layer 171 such that a portion of encapsulant 172 is not exposed while mounted to carrier tape 170 and thermally releasable layer 171. In one embodiment, encapsulant 212 is selected to have a low CTE and a high filler or fiber content with respect to encapsulant 172. The CTE and filler or fiber of encapsulant 212 are selected to balance and control the overall warpage of the reconstituted wafer. Balancing the effective CTEs of encapsulants 172 and 212 provides improved warpage control at both the wafer level and for individual WLCSPs with respect to use of a single encapsulant. Balancing the effective CTEs of encapsulants 172 and 212 also reduces warpage which improves the subsequent formation of RDLs and improves performance in reliability tests, and reduces CTE mismatch for second level interconnection that occurs, for example, when the Fo-WLCSP is mounted to a PCB or printed wiring board (PWB). The balancing of the effective CTE for the Fo-WLCSP is achieved by adjusting a ratio of a thickness of encapsulant 172 with respect to a thickness of encapsulant 212. The balancing of the effective CTE for the Fo-WLCSP is also achieved by adjusting a ratio of the CTE of encapsulant 172 with respect to a CTE of encapsulant 212.

FIG. 5*p*, similar to FIG. 5*o*, shows another embodiment of semiconductor die 124 mounted to carrier 168 removed from chase mold 208 and embedded within encapsulant 212. Encapsulant 212 is shown with surface 222 of the encapsulant formed over back surface 128 of semiconductor die 124. Alternatively, encapsulant 212 is deposited coplanar with back surface 128 of semiconductor die 124 so that the back surface is exposed from the encapsulant. FIG. 5*p* differs from FIG. 5*o* in that the size of chase mold 208 is substantially equal to the size of chase mold 174 such that peripheral portion 224 of encapsulant 212 shown in FIG. 5*o* is no longer present.

In FIG. 5*q*, carrier 168, carrier tape 170, and thermally releasable layer 171 are fully debonded and removed from encapsulant 172 and semiconductor die 144 by activating thermally releasable layer 171. Alternatively, debonding is accomplished by chemical etching, mechanical peeling, CMP, mechanical grinding, thermal bake, UV light, laser scanning, or wet stripping. Removal of carrier 168, carrier tape 170, and thermally releasable layer 171 exposes surface 230 of encapsulant 172 and further exposes insulating layer 158 and conductive layer 154 of semiconductor die 144. A portion of encapsulant 172 outside a footprint of semiconductor die 144 is removed. The removed portion of encapsulant 172 extends from surface 230 partially but not completely through the encapsulant to expose surface 232. The removed portion of encapsulant 172 is removed by an etching process, CMP, LDA, or other suitable process such that surface 230 is vertically offset with respect to surface 232. Surface 232 is opposite surface 196 of encapsulant 172 and is substantially coplanar with surface 196 and with a surface of insulating layer 158. Surface 230 is connected to surface 232 by connecting portion 234 which is vertical or tapered. Alternatively, surface 230 can be vertically offset with respect to surface 232 and connecting portion 234 by the formation of an insulating or passivation layer over carrier 168, carrier tape 170, and thermally releasable layer 171 before depositing encapsulant 172.

In FIG. 5r, a first portion of a fan-out interconnect or RDL is formed by the deposition and patterning of insulating or passivation layer 238 and the deposition and patterning of conductive layer 240. Insulating layer 238 is conformally applied to, and has a first surface that follows the contours of, encapsulant 172, insulating layer 158, and openings 160. Insulating layer 238 has a second planar surface opposite the first surface. Insulating layer 238 contains one or more layers of SiO2, Si3N4, SiON, Ta2O5, Al2O3, or other material having similar insulating and structural properties. Insulating layer 238 is deposited using printing, spin coating, spray coating, lamination, or other suitable process. A portion of insulating layer 238 is removed by laser ablation, etching, or other suitable process to expose conductive layer 154 of semiconductor die 144 for subsequent electrical interconnection according to the configuration and design of the semiconductor die.

An electrically conductive layer 240 is patterned and deposited over insulating layer 238 and semiconductor die 144. Conductive layer 240 can be one or more layers of Al, Cu, Sn, Ni, Au, Ag, or other suitable electrically conductive material. The deposition of conductive layer 240 uses PVD, CVD, electrolytic plating, electroless plating, or other suitable process. The openings in insulating layer 238 extend completely through the insulating layer over conductive layer 154 and are filled with conductive layer 240. Conductive layer 240 operates as a RDL to extend electrical connection from semiconductor die 144 to points external to semiconductor die 144.

In FIG. 5s, insulating layer 242 is conformally applied to, and has a first surface that follows the contours of encapsulant 172, insulating layer 238, and conductive layer 240. Insulating layer 242 has a second planar surface opposite the first surface. Insulating layer 242 contains one or more layers of SiO2, Si3N4, SiON, Ta2O5, Al2O3, or other material having similar insulating and structural properties. Insulating layer 242 is deposited using printing, spin coating, spray coating, lamination, or other suitable process. A portion of insulating layer 238 is removed by laser ablation, etching, or other suitable process to expose a portion of conductive layer 240 for subsequent electrical interconnect with conductive bumps.

An electrically conductive bump material is deposited over conductive layer 240 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 240 using a suitable attachment or bonding process. In one embodiment, the bump material is reflowed by heating the material above its melting point to form balls or bumps 244. In some applications, bumps 244 are reflowed a second time to improve electrical contact to conductive layer 240. An under bump metallization (UBM) layer can be formed under bumps 244. Bumps 244 can also be compression bonded to conductive layer 240. Bumps 244 represent one type of interconnect structure that can be formed over conductive layer 240. The interconnect structure can also be stud bumps, micro bumps, or other electrical interconnect.

Taken together, insulating layers 238 and 242 as well as conductive layer 240 and conductive bumps 244 form interconnect structure 246. The number of insulating and conductive layers included within interconnect structure 246 depends on, and varies with, the complexity of circuit routing design. Accordingly, interconnect structure 246 can include any number of insulating and conductive layers to facilitate electrical interconnect with respect to semiconductor die 144, semiconductor die 124, and points external to the Fo-WLCSP.

In FIG. 5t, backgrinding tape 248 is applied over encapsulant 172, insulating layers 238 and 242, and around conductive bumps 244. Backgrinding tape 248 provides structural support and protects conductive bumps 244 during subsequent manufacturing operations. For example, surface 249 of encapsulant 212 undergoes a grinding operation with grinder 250 to planarize the surface and reduce thickness of the encapsulant. The grinding operation removes encapsulant 212 to expose a surface 251 of the encapsulant. In one embodiment, surface 251 is vertically offset with respect to back surface 128 of semiconductor die 124. Alternatively, surface 251 is coplanar with respect to a back surface of semiconductor die 124. A chemical etch can also be used to remove and planarize encapsulant 212. After the backgrinding or etching of encapsulant 212, backgrinding tape 248 is removed. While FIG. 5t shows backgrinding of encapsulant 212 occurs after the formation of interconnect structure 246, the backgrinding of the encapsulant can also occur before the formation of the interconnect structure. When backgrinding occurs before completion of interconnect structure 246, backgrinding tape 248 is removed after the backgrinding to facilitate formation of the interconnect structure.

In FIG. 5u, the reconstituted or reconfigured wafer level package from FIG. 5t is singulated through encapsulant 172 and encapsulant 212 with a saw blade or laser cutting tool 252 into individual Fo-WLCSP 254. Singulation occurs before or after removal of backgrinding tape 248. Thus, Fo-WLCSP 254 includes TSVs 152 and dual encapsulants for balancing CTEs. Encapsulant 172 is selected to have a high CTE and a low filler or fiber content with respect to encapsulant 212. Encapsulant 212 is selected to have a low CTE and a high filler or fiber content with respect to encapsulant 172. The CTE and filler or fiber content of encapsulants 172 and 212 is selected to balance and control the overall warpage of the reconstituted wafer. By balancing the effective CTEs of encapsulants 172 and 212, improved warpage control for Fo-WLCSP 254 is achieved. Reduced warpage improves formation of RDLs, improves performance in reliability tests, and reduces CTE mismatch for second level interconnection that occurs, for example, when the Fo-WLCSP is mounted to a PCB or PWB. The balancing of the effective CTE for the Fo-WLCSP is achieved by adjusting a ratio of a thickness of encapsulant 172 with respect to a thickness of encapsulant 212. The balancing of the effective CTE for the Fo-WLCSP is also achieved by adjusting a ratio of the CTE of encapsulant 172 with respect to a CTE of encapsulant 212.

Portions of encapsulant 172 and semiconductor die 144 are removed by an etching process, e.g. back grinding and plasma etching with high selectivity, while mounted over carrier 168 to expose bottom surface 192 and sidewalls 194 of conductive TSVs 152. The exposed sidewalls provide a vertical offset between bottom surface 192 of TSVs 152 and surface 190 of semiconductor die 144. The vertical offset is of sufficient size that encapsulant 212 is disposed in the gap alleviating a need for disposing a separate or additional under fill material in the gap.

Accordingly, the method of making the semiconductor device includes depositing encapsulants 172 and 212 over and around semiconductor die 144 and 124 while in chase mold 208. The method further includes forming encapsulant 172 with elevated portion 198 in a periphery of encapsulant 172 to reduce warpage. The method further includes the steps of removing a portion of semiconductor die 144 to expose bottom surface 192 of TSVs 152 and to offset bottom surface 192 of TSVs 152 with respect to surface 190 of encapsulant 172, forming gap 204 between the semiconductor die 144 and 124 by mounting semiconductor die 124 to bottom surface 192 of TSVs 152, and depositing encapsulant 212 into gap 204 between semiconductor die 144 and 124. The method further includes encapsulant 172 having a first filler or fiber content. Encapsulant 212 has a second filler or fiber content greater than the first filler or fiber content. The first CTE is greater than the second CTE.

Figure 6:
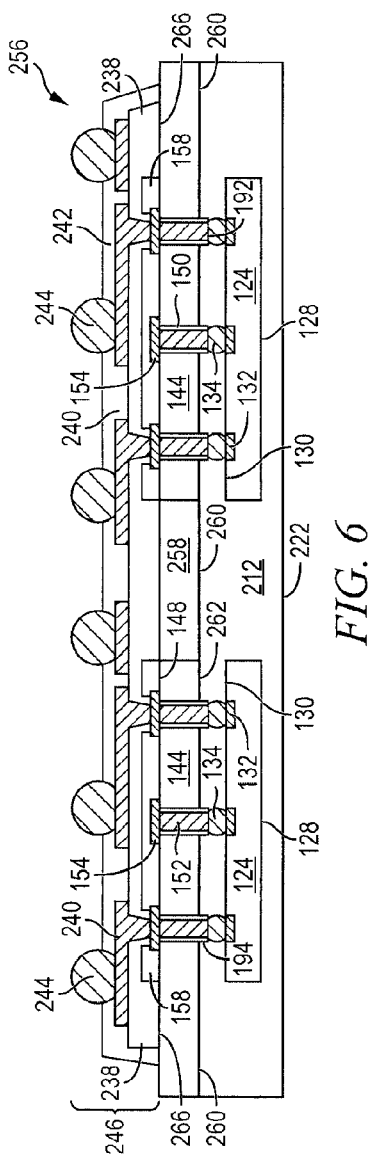
FIG. 6 illustrates another embodiment of a Fo-WLCSP including stacked semiconductor die with TSVs and multiple encapsulants.

In FIG. 6, a Fo-WLCSP 256 with TSVs and dual encapsulants for balancing coefficients of thermal expansion similar to Fo-WLCSP 254 from FIG. 5u is shown. FIG. 6 includes encapsulant 258 that, like FIG. 5j, differs from FIG. 5u by the omission of elevated portion 198. In Fo-WLCSP 256, surface 260 of encapsulant 258 is substantially coplanar with surface 262 of semiconductor die 144 from a periphery of the semiconductor die extending to a perimeter portion of encapsulant 258. The formation of encapsulant 258 forms a reconstituted wafer including semiconductor die 144 with TSVs 152. Encapsulant 258 is selected to have a high CTE and a low filler or fiber content with respect to encapsulant 212. A second encapsulant, encapsulant 212, is formed over encapsulant 258 and around semiconductor die 124. Encapsulant 212 is selected to have a low CTE and a high filler or fiber content with respect to encapsulant 258. The CTE and filler or fiber content of encapsulants 258 and 212 are selected to balance and control the overall warpage of the reconstituted wafer. By balancing the effective CTEs of encapsulants 258 and 212, improved warpage control for Fo-WLCSP 256 is achieved. Reduced warpage also improves the formation of RDLs, improves performance in reliability tests, and reduces CTE mismatch for second level interconnection that occurs, for example, when the Fo-WLCSP is mounted to a PCB or PWB. The balancing of the effective CTE for the Fo-WLCSP is achieved by adjusting a ratio of a thickness of encapsulant 258 with respect to a thickness of encapsulant 212. The balancing of the effective CTE for the Fo-WLCSP is also achieved by adjusting a ratio of the CTE of encapsulant 258 with respect to a CTE of encapsulant 212.

After the formation of encapsulant 258, a portion of the encapsulant is removed by an etching process, CMP, LDA, or other suitable process while mounted over a temporary carrier similar to the process shown in FIG. 5j. In one embodiment, a back grinding and plasma etch process with high selectivity is used to remove a portion of encapsulant 258 to expose surface 262 of semiconductor die 144, surface 260 of encapsulant 258, and bottom surface 192 and sidewalls 194 of TSVs 152. Semiconductor die 124 are mounted with bumps 134 to bottom surface 192 of TSVs 152 using a suitable bonding process such as thermal bonding or ultrasonic bonding. The exposed sidewalls 194 provide a vertical offset between bottom surface 192 of TSVs 152 and surface 262 of semiconductor die 144. The vertical offset is of sufficient size that encapsulant 212 is disposed in a gap between semiconductor die 124 and surface 262 of semiconductor die 144, thereby alleviating a need for disposing a separate or additional under fill material in the gap.

Fo-WLCSP 256 also differs from Fo-WLCSP 254 shown in FIG. 5u by the alignment of surface 266 of encapsulant 258 with respect to insulating layer 158 and active surface 148. Rather than aligning surface 266 to be substantially coplanar with insulating layer 158, as shown in FIG. 5u, surface 266 is substantially coplanar with respect to active surface 148 and vertically offset with respect to insulating layer 158.

Figure 7A:
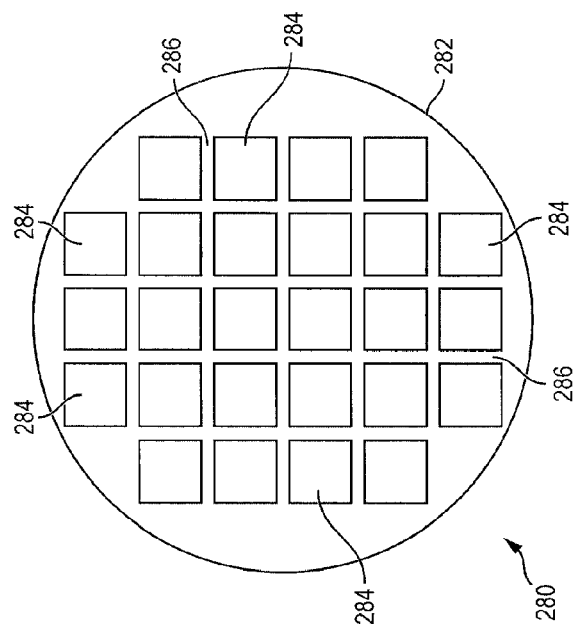
FIGS. 7a-7c illustrate a semiconductor wafer with a plurality of semiconductor die separated by saw streets.

FIG. 7a shows a semiconductor wafer 280 with a base substrate material 282, such as silicon, germanium, gallium arsenide, indium phosphide, or silicon carbide, for structural support. A plurality of semiconductor die or components 284 is formed on semiconductor wafer 280 separated by a non-active, inter-die wafer area or saw street 286 as described above. Saw street 286 provides cutting areas to singulate semiconductor wafer 280 into individual semiconductor die 284.

Figure 7B:
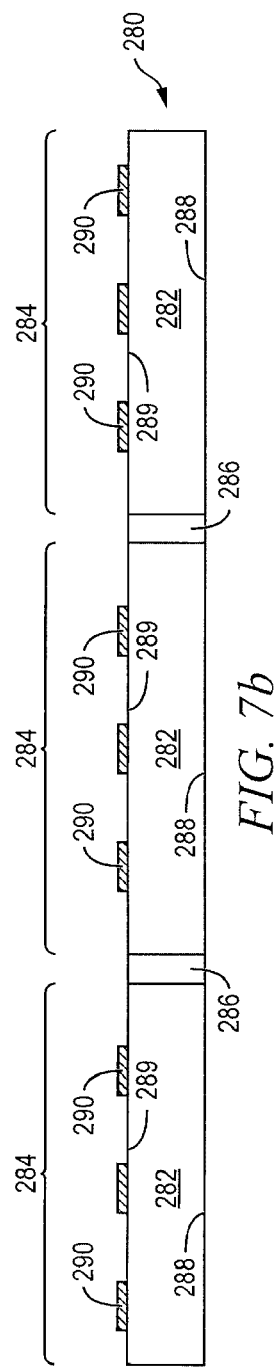

FIG. 7b shows a cross-sectional view of a portion of semiconductor wafer 280. Each semiconductor die 284 has a back surface 288 and active surface 289 containing analog or digital circuits implemented as active devices, passive devices, conductive layers, and dielectric layers formed within the die and electrically interconnected according to the electrical design and function of the semiconductor die. For example, the circuit may include one or more transistors, diodes, and other circuit elements formed within active surface 289 to implement analog circuits or digital circuits, such as DSP, ASIC, memory, or other signal processing circuit. Semiconductor die 284 may also contain IPDs, such as inductors, capacitors, and resistors, for RF signal processing.

An electrically conductive layer 290 is formed over active surface 289 using PVD, CVD, electrolytic plating, electroless plating process, or other suitable metal deposition process. Conductive layer 290 can be one or more layers of Al, Cu, Sn, Ni, Au, Ag, or other suitable electrically conductive material. Conductive layer 290 operates as contact pads electrically connected to the circuits on active surface 289. Conductive layer 290 can be formed as contact pads disposed side-by-side a first distance from the edge of semiconductor die 284, as shown in FIG. 7b. Alternatively, conductive layer 290 can be formed as contact pads offset in multiple rows such that a first row of contact pads is disposed a first distance from the edge of the die, and a second row of contact pads alternating with the first row is disposed a second distance from the edge of the die.

Figure 7C:
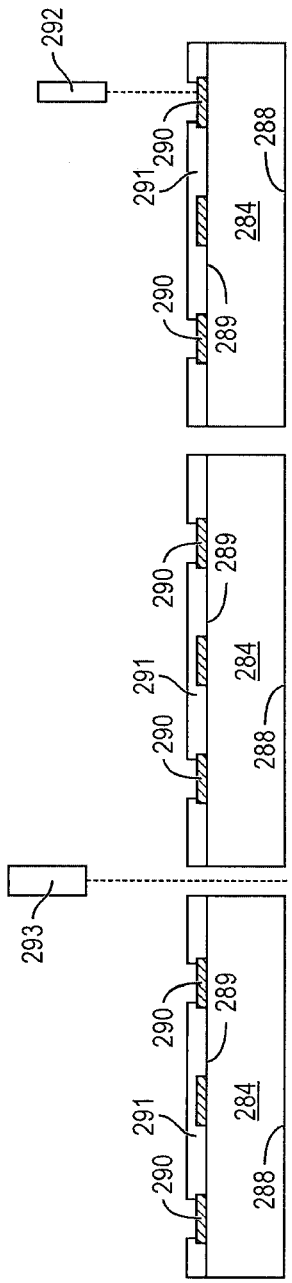

FIG. 7c further shows an insulating or passivation layer 291 is formed over active surface 289 of semiconductor die 284 with openings formed over conductive layer 290. Insulating layer 291 can be formed using PVD, CVD, printing, spin coating, spray coating, sintering or thermal oxidation. The insulating layer 291 contains one or more layers of SiO2, Si3N4, SiON, Ta2O5, Al2O3, or other material having similar insulating and structural properties. A portion of insulating layer 291 is removed by an etching or other suitable process to form openings that expose conductive layer 290 for subsequent electrical interconnect. In one embodiment, the openings are formed by LDA using laser 292. Furthermore, semiconductor wafer 280 is singulated through saw street 286 using a saw blade or laser cutting tool 293 into individual semiconductor die 284.

Figure 8A:
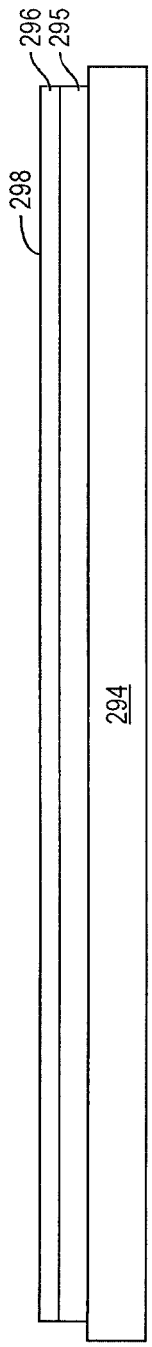
FIGS. 8a-8n illustrate a process of forming a Fo-WLCSP including multiple encapsulants.

FIGS. 8a-8n illustrate a process of forming a Fo-WLCSP with dual encapsulants for balancing coefficients of thermal expansion similar to FIGS. 5a-5u. FIG. 8a shows a cross sectional view of a portion of temporary substrate or carrier 294 containing sacrificial or recyclable base material such as silicon, steel, polymer, beryllium oxide, or other suitable low-cost, rigid material for structural support. An interface layer or carrier tape 295 is formed or laminated over carrier 294 as a temporary adhesive bonding film and support layer. A thermally releasable layer 296 is formed or laminated on carrier tape 295 and over carrier 294. Thermally releasable layer 296 includes a top surface 297 that is configured to receive later mounted semiconductor die, and is further configured to be removed after the formation of a first encapsulating layer.

In FIG. 8b, semiconductor die 284 from FIGS. 7a-7c are positioned over carrier 294, carrier tape 295, and thermally releasable layer 296 with active surface 289 oriented toward the carrier. Semiconductor die 284 are mounted to carrier 294, carrier tape 295, and thermally releasable layer 296 as part of a reconstituted or reconfigured wafer level package. Semiconductor die 284 are mounted such that active surface 289 is substantially coplanar with surface 297 of thermally releasable layer 296. In one embodiment, insulating layer 291 is vertically offset with respect to thermally releasable layer 296 after being mounted over carrier 294.

FIG. 8c shows semiconductor die 284 are mounted to carrier 294, carrier tape 295, and thermally releasable layer 296. An encapsulant or molding compound 298 is pre-dispensed or laminated over carrier 294, carrier tape 295, thermally releasable layer 296, and around semiconductor die 284. Encapsulant 298 can be polymer composite material, such as epoxy resin with filler or fiber, epoxy acrylate with filler or fiber, or polymer with proper filler or fiber. In one embodiment, encapsulant 298 is selected to have a high CTE and a low filler or fiber content with respect to a subsequently selected encapsulant or molding compound. Semiconductor die 284 are embedded together in encapsulant 298 which is non-conductive and environmentally protects the semiconductor device from external elements and contaminants.

FIG. 8d shows chase mold 299 is brought together with carrier 294, carrier tape 295, and thermally releasable layer 296 to enclose semiconductor die 284 and encapsulant 298 within the mold for encapsulation. Chase mold 299 is brought together with carrier 294, carrier tape 295, and thermally releasable layer 296 by moving chase mold 299 around semiconductor die 284 and encapsulant 298, or alternatively, by moving the semiconductor die and encapsulant into the mold. In one embodiment, chase mold 299 includes only a first or top portion that is brought together with carrier 294, carrier tape 295, and thermally releasable layer 296 without a second or bottom mold portion. Carrier 294, carrier tape 295, and thermally releasable layer 296 serve as the bottom mold portion for the encapsulation process. Alternatively, semiconductor die 284, carrier 294, carrier tape 295, and thermally releasable layer 296 may be disposed within a mold including multiple portions, such as top and bottom portions. After semiconductor die 284 and encapsulant 298 are disposed within chase mold 299, the encapsulant can be partially or completely cured. After semiconductor die 284 are embedded within encapsulant 298 as a reconstituted wafer, the reconstituted wafer is removed from chase mold 299.

FIG. 8e, continuing from FIG. 8b, shows semiconductor die 284 are mounted to carrier 294, carrier tape 295, and thermally releasable layer 296. FIGS. 8e-8g, similar to FIGS. 8c and 8d, show an embodiment in which encapsulant 298 is deposited over carrier 294, carrier tape 295, thermally releasable layer 296, and around semiconductor die 284. Encapsulant 298 is deposited using a paste printing, compressive molding, transfer molding, liquid encapsulant molding, vacuum lamination, spin coating, or other suitable applicator. Specifically, FIG. 8e shows a chase mold 300 with a plurality of inlets 301a and 301b brought together with carrier 294, carrier tape 295, and thermally releasable layer 296 to enclose semiconductor die 284 within the mold for subsequent encapsulation. Chase mold 300 is brought together by moving chase mold 300 around semiconductor die 284, or alternatively, by moving the semiconductor die into the mold. Chase mold 300 includes only a first or top portion that is brought together with carrier 294, carrier tape 295, and thermally releasable layer 296 without a second or bottom mold portion. Carrier 294, carrier tape 295, and thermally releasable layer 296 serve as the bottom mold portion for the subsequent encapsulation process. Alternatively, semiconductor die 284, carrier 294, carrier tape 295, and thermally releasable layer 296 may be disposed within a mold including multiple portions, such as top and bottom portions.

FIG. 8f shows chase mold 300 encloses semiconductor die 284 with open space 304. Open space 304 extends between chase mold 300 to semiconductor die 284 and thermally releasable layer 296. Encapsulant 298, in a liquid state, is injected through inlet 301a into one side of chase mold 300 with nozzle 306 while an optional vacuum assist 308 draws pressure from the opposite side through inlet 301b to uniformly fill open space 304 with the encapsulant. The viscosity of encapsulant 298 is selected for uniform coverage, e.g., a lower viscosity increases the flow of the encapsulant for molding, paste printing, and spin coating. Semiconductor die 284 are embedded together in encapsulant 298 which is non-conductive and environmentally protects the semiconductor device from external elements and contaminants.

FIG. 8g shows encapsulant 298 has filled open space 304 between chase mold 300 and carrier 294, carrier tape 295, and thermally releasable layer 296. Encapsulant 298 is further disposed around semiconductor die 284.

Figure 8H:
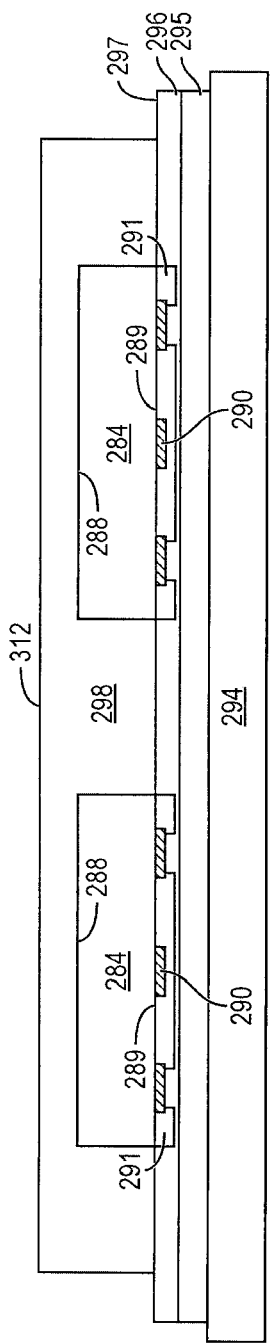

FIG. 8h, continuing from FIG. 8d or 8g, shows semiconductor die 284 mounted to carrier 294, carrier tape 295, and thermally releasable layer 296 and embedded within encapsulant 298 as a reconstituted wafer after having been removed from chase mold 300. Encapsulant 298 is shown with a surface 312 of the encapsulant formed over back surface 288 of semiconductor die 284. Alternatively, encapsulant 298 is deposited coplanar with back surface 288 of semiconductor die 284 so that the back surface is exposed from the encapsulant.

Figure 8I:
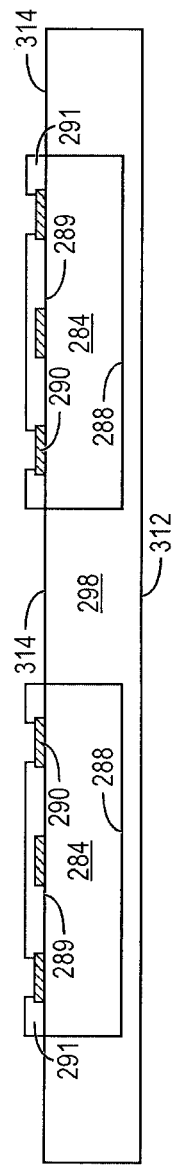

In FIG. 8i, temporary carrier 294, carrier tape 295, and thermally releasable layer 296 are fully debonded and removed from encapsulant 298 and semiconductor die 284 by activating thermally releasable layer 296. Alternatively, debonding is accomplished by chemical etching, mechanical peeling, CMP, mechanical grinding, thermal bake, UV light, laser scanning, or wet stripping. Removal of temporary carrier 294, carrier tape 295, and thermally releasable layer 296 exposes surface 314 of encapsulant 298 and further exposes insulating layer 291 and conductive layer 290 of semiconductor die 284.

Figure 8J:
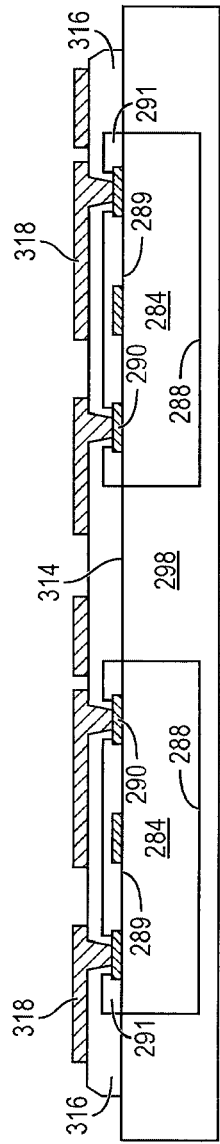

In FIG. 8j, a first portion of a fan-out interconnect or RDL is formed by the deposition and patterning of insulating or passivation layer 316 and the deposition and patterning of conductive layer 318. Insulating layer 316 is conformally applied to, and has a first surface that follows the contours of encapsulant 298, insulating layer 291, and the openings in insulating layer 291. Insulating layer 316 has a second planar surface opposite the first surface. Insulating layer 316 contains one or more layers of SiO2, Si3N4, SiON, Ta2O5, Al2O3, or other material having similar insulating and structural properties. Insulating layer 316 is deposited using printing, spin coating, spray coating, lamination, or other suitable process. A portion of insulating layer 316 is removed by laser ablation, etching, or other suitable process to expose conductive layer 290 of semiconductor die 284 for subsequent electrical interconnection according to the configuration and design of the semiconductor die.

An electrically conductive layer 318 is patterned and deposited over insulating layer 316 and semiconductor die 284. Conductive layer 318 can be one or more layers of Al, Cu, Sn, Ni, Au, Ag, or other suitable electrically conductive material. The deposition of conductive layer 318 uses PVD, CVD, electrolytic plating, electroless plating, or other suitable process. The openings in insulating layer 316 extend completely through the insulating layer over conductive layer 290 and are filled with conductive layer 318. Conductive layer 318 operates as a RDL to extend electrical connection from semiconductor die 284 to points external to semiconductor die 284 through the openings.

Figure 8K:
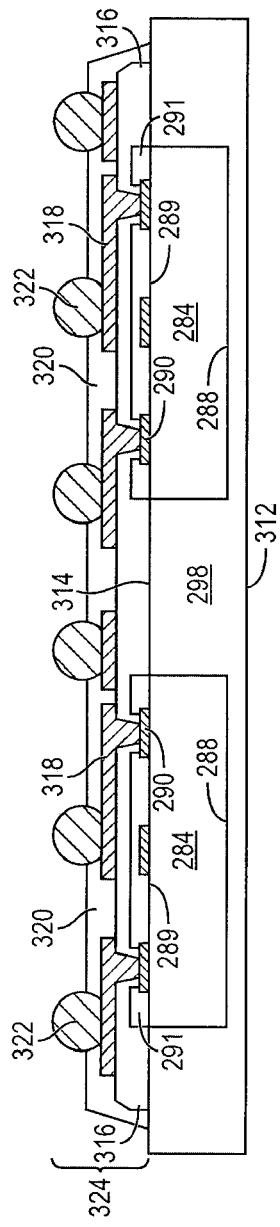

In FIG. 8k, insulating layer 320 is conformally applied to, and has a first surface that follows the contours of encapsulant 298, insulating layer 316, and conductive layer 318. Insulating layer 320 has a second planar surface opposite the first surface. Insulating layer 320 contains one or more layers of SiO2, Si3N4, SiON, Ta2O5, Al2O3, or other material having similar insulating and structural properties. Insulating layer 320 is deposited using printing, spin coating, spray coating, lamination, or other suitable process. A portion of insulating layer 316 is removed by laser ablation, etching, or other suitable process to expose a portion of conductive layer 318 for subsequent electrical interconnect with conductive bumps.

An electrically conductive bump material is deposited over conductive layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form balls or bumps 322. In some applications, bumps 322 are reflowed a second time to improve electrical contact to conductive layer 318. A UBM layer can be formed under bumps 322. Bumps 322 can also be compression bonded to conductive layer 318. Bumps 322 represent one type of interconnect structure that can be formed over conductive layer 318. The interconnect structure can also be stud bumps, micro bumps, or other electrical interconnect.

Taken together, insulating layers 316 and 320 as well as conductive layer 318 and conductive bumps 322 form interconnect structure 324. The number of insulating and conductive layers included within interconnect structure 324 depends on, and varies with, the complexity of circuit routing design. Accordingly, interconnect structure 324 can include any number of insulating and conductive layers to facilitate electrical interconnect with respect to semiconductor die 284, and points external to the Fo-WLCSP.

Figure 8L:
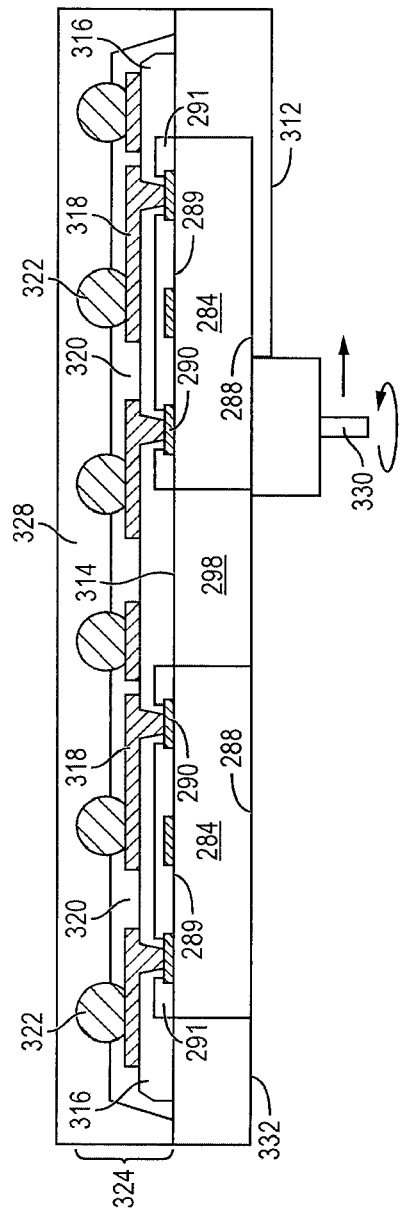

In FIG. 8l, backgrinding tape 328 is applied over encapsulant 298, insulating layers 316 and 320, and around conductive bumps 322. Backgrinding tape 328 provides structural support and protects conductive bumps 322 during subsequent manufacturing operations. For example, surface 312 of encapsulant 298 undergoes a grinding operation with grinder 330 to planarize the surface and reduce thickness of the encapsulant. The grinding operation removes a portion of encapsulant 298 to expose a surface 332 of the encapsulant. In one embodiment, surface 332 is coplanar with respect to back surface 288 of semiconductor die 284. Alternatively, surface 332 is vertically offset with respect to back surface 288 of semiconductor die 284. A chemical etch can also be used to remove and planarize encapsulant 298.

In FIG. 8m, an encapsulant or molding compound 336 is deposited over semiconductor die 284 and over surface 332 of encapsulant 298 using a paste printing, compressive molding, transfer molding, liquid encapsulant molding, vacuum lamination, spin coating, or other suitable applicator. In one embodiment, encapsulant 336 is applied in a chase molding process similar to the process shown in FIGS. 5m-5p. Encapsulant 336 can be polymer composite material, such as epoxy resin with filler or fiber, epoxy acrylate with filler or fiber, or polymer with proper filler or fiber. The viscosity of encapsulant 336 is selected for uniform coverage, e.g., a lower viscosity increases the flow of the encapsulant for molding, paste printing, and spin coating. Semiconductor die 284 are fully embedded together in encapsulant 336 which is non-conductive and environmentally protects the semiconductor die from external elements and contaminants. In one embodiment, encapsulant 336 is selected to have a low CTE and a high filler or fiber content with respect to encapsulant 298. The CTE and filler or fiber of encapsulant 336 is selected to balance and control the overall warpage of the reconstituted wafer. Balancing the effective CTEs of encapsulants 336 and 298 provides improved warpage control at both the wafer level and for individual WLCSPs with respect to use of a single encapsulant. Balancing the effective CTEs of encapsulants 336 and 298 further reduce warpage which improves the subsequent formation of RDLs and improves performance in reliability tests. Balancing the effective CTEs of encapsulants 336 and 298 also reduces CTE mismatch for second level interconnection that occurs, for example, when the Fo-WLCSP is mounted to a PCB or PWB. In one embodiment, encapsulant 336 has a thickness greater than 40 µm and a CTE greater than 15 parts per million (ppm). The balancing of the effective CTE for the Fo-WLCSP is achieved by adjusting a ratio of a thickness of encapsulant 298 with respect to a thickness of encapsulant 336. The balancing of the effective CTE for the Fo-WLCSP is also achieved by adjusting a ratio of the CTE of encapsulant 298 with respect to a CTE of encapsulant 336.

FIG. 8n shows backgrinding tape 328 is removed after backgrinding encapsulant 298, the formation of bumps 322, and the formation of encapsulant 336. While FIG. 8l shows backgrinding of encapsulant 298 occurs after the formation of interconnect structure 324, the backgrinding of the encapsulant can also occur before the formation of the interconnect structure. When backgrinding occurs before completion of interconnect structure 324, backgrinding tape 328 is removed after the backgrinding to facilitate the subsequent formation of the interconnect structure.

FIG. 8n further shows the reconstituted or reconfigured wafer level package from FIG. 8m is singulated through encapsulant 298 and encapsulant 336 with a saw blade or laser cutting tool 338 into individual Fo-WLCSPs 340. Thus, Fo-WLCSP 340 includes dual encapsulants for balancing Fo-WLCSP CTEs. Encapsulant 298 is selected to have a high CTE and a low filler or fiber content with respect to encapsulant 336. Encapsulant 336 is selected to have a low CTE and a high filler or fiber content with respect to encapsulant 298.

The CTE and filler or fiber content of encapsulants 298 and 336 are selected to balance and control the overall warpage of the reconstituted wafer. By balancing the effective CTEs of encapsulants 298 and 336, improved warpage control for Fo-WLCSP 340 is achieved. Reduced warpage also improves the subsequent formation of RDLs and improves performance of Fo-WLCSP 340 in reliability tests. Balancing the effective CTEs of encapsulants 336 and 298 further reduces CTE mismatch for second level interconnection which occurs, for example, when Fo-WLCSP 340 is mounted to a PCB or PWB. The balancing of the effective CTE for the Fo-WLCSP is achieved by adjusting a ratio of a thickness encapsulant 298 with respect to a thickness of encapsulant 336. The balancing of the effective CTE for the Fo-WLCSP is also achieved by adjusting a ratio of the CTE of encapsulant 298 with respect to a CTE of encapsulant 336.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a carrier with a thermally releasable layer;
    mounting a first semiconductor die including through silicon vias (TSVs) to the thermally releasable layer;
    depositing a first encapsulant having a first coefficient of thermal expansion (CTE) over the first semiconductor die;
    exposing a surface of the TSVs;
    mounting a second semiconductor die to the surface of the TSVs;
    depositing a second encapsulant having a second CTE over the first semiconductor die and second semiconductor die; and
    forming an interconnect structure over the first and second semiconductor die.

2. The method of claim 1, further including forming the first and second encapsulants over and around the first and second semiconductor die with a chase mold.

3. The method of claim 1, further including forming the first encapsulant with an elevated portion in a periphery of the first encapsulant to reduce warpage.

4. The method of claim 1, further including:
    removing a portion of the first semiconductor die to expose the surface of the TSVs and to offset the surface of the TSVs with respect to a surface of the first encapsulant;
    forming a gap between the first and second semiconductor die by mounting the second semiconductor die to the surface of the TSVs; and
    depositing the second encapsulant in the gap between the first and second semiconductor die.

5. The method of claim 1, wherein:
    the first encapsulant has a first filler content;
    the second encapsulant has a second filler content greater than the first filler content; and
    the first CTE is greater than the second CTE.

6. A method of making a semiconductor device, comprising:
    providing a carrier;
    mounting a first semiconductor die including through silicon vias (TSVs) to the carrier;
    depositing a first encapsulant having a first coefficient of thermal expansion (CTE) over the first semiconductor die;
    exposing a surface of the TSVs;
    mounting a second semiconductor die to the surface of the TSVs; and
    depositing a second encapsulant having a second CTE over the first semiconductor die and second semiconductor die.

7. The method of claim 6, further including forming the first and second encapsulants over and around the first and second semiconductor die with a chase mold.

8. The method of claim 6, further including forming the first encapsulant with an elevated portion in a periphery of the first encapsulant to reduce warpage.

9. The method of claim 6, further including:
    removing a portion of the first semiconductor die to expose the surface of the TSVs and to offset the surface of the TSVs with respect to a surface of the first encapsulant;
    forming a gap between the first and second semiconductor die by mounting the second semiconductor die to the surface of the TSVs; and
    depositing the second encapsulant in the gap between the first and second semiconductor die.

10. The method of claim 6, wherein:
    the first encapsulant has a first filler content;
    the second encapsulant has a second filler content greater than the first filler content; and
    the first CTE is greater than the second CTE.

11. The method of claim 6, wherein the carrier includes a thermally releasable layer for separating the first semiconductor die and first encapsulant from the carrier.

12. The method of claim 11, further including forming an interconnect structure over the first semiconductor die and first encapsulant after removing the carrier.

13. A method of making a semiconductor device, comprising:
    providing a carrier;
    mounting a first semiconductor die over the carrier;
    depositing a first encapsulant having a first coefficient of thermal expansion (CTE) over the first semiconductor die;
    depositing a second encapsulant having a second CTE over the first semiconductor die and first encapsulant; and
    forming an interconnect structure over the first semiconductor die and first encapsulant.

14. The method of claim 13, further including:
    removing a portion of the first semiconductor die to expose through silicon vias (TSVs) within the first semiconductor die; and
    mounting a second semiconductor die to the TSVs.

15. The method of claim 13, further including forming the first and second encapsulants over and around the first semiconductor die with a chase mold.

16. The method of claim 13, further including forming the first encapsulant with an elevated portion in a periphery of the first encapsulant to reduce warpage.

17. The method of claim 13, wherein the carrier includes a thermally releasable layer for separating the first semiconductor die and first encapsulant from the carrier.

18. The method of claim 14, further including:
    removing a portion of the first semiconductor die to expose the TSVs and to offset a surface of the TSVs with respect to a surface of the first encapsulant;
    forming a gap between the first and second semiconductor die by mounting the second semiconductor die to the surface of the TSVs; and
    depositing the second encapsulant in the gap between the first and second semiconductor die.

19. The method of claim 13, wherein:
    the first encapsulant has a first filler content;

the second encapsulant has a second filler content greater than the first filler content; and the first CTE is greater than the second CTE.

20. A semiconductor device, comprising:
- a first semiconductor die including through silicon vias (TSVs);
- a first encapsulant having a first coefficient of thermal expansion (CTE) formed over the first semiconductor die;
- a second semiconductor die mounted to the TSVs; and
- a second encapsulant having a second CTE formed over the first semiconductor die and second semiconductor die.

21. The semiconductor device of claim 20, wherein the first encapsulant includes an elevated portion in a periphery of the first encapsulant to reduce warpage.

22. The semiconductor device of claim 20, further including:
- a gap between the first and second semiconductor die; and
- a portion of the second encapsulant disposed within the gap.

23. The semiconductor device of claim 20, wherein:
the first encapsulant has a first filler content;
the second encapsulant has a second filler content greater than the first filler content; and
the first CTE is greater than the second CTE.

24. The semiconductor device of claim 20, further including an interconnect structure formed over the first semiconductor die and first encapsulant.

\* \* \* \* \*